United States Patent
Cai et al.

(10) Patent No.: US 12,501,655 B2
(45) Date of Patent: Dec. 16, 2025

(54) OVERHANGING SOURCE/DRAIN CONTACT

(71) Applicant: Taiwan Semiconductor Manufacturing Company, Ltd., Hsinchu (TW)

(72) Inventors: Chung-Hao Cai, Hsinchu (TW); Yen-Jun Huang, Hsinchu (TW); Ting Fang, Hsinchu (TW); Chia-Hsien Yao, Hsinchu (TW); Cheng-Ming Lee, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 699 days.

(21) Appl. No.: 17/502,804

(22) Filed: Oct. 15, 2021

(65) Prior Publication Data

US 2022/0223743 A1  Jul. 14, 2022

Related U.S. Application Data

(60) Provisional application No. 63/137,023, filed on Jan. 13, 2021.

(51) Int. Cl.
  *H10D 30/67* (2025.01)
  *H10D 30/01* (2025.01)

(52) U.S. Cl.
  CPC ....... *H10D 30/6713* (2025.01); *H10D 30/031* (2025.01); *H10D 30/6735* (2025.01)

(58) Field of Classification Search
  CPC ......... H01L 29/78618; H01L 29/42392; H01L 29/66742; H10D 30/6713; H10D 30/6735; H10D 30/031
  USPC ........................................................ 257/288
  See application file for complete search history.

(56) References Cited

U.S. PATENT DOCUMENTS

| | | | |
|---|---|---|---|
| 11,127,684 B2 | 9/2021 | Wang et al. | |
| 2009/0206374 A1* | 8/2009 | Anderson | H01L 29/785 257/270 |
| 2012/0115330 A1 | 5/2012 | Mukherjee | |
| 2013/0134486 A1* | 5/2013 | LiCausi | H01L 21/32139 438/585 |

(Continued)

FOREIGN PATENT DOCUMENTS

| KR | 20050032363 A | 4/2005 |
|---|---|---|
| KR | 20170063354 A | 6/2017 |

(Continued)

*Primary Examiner* — Eric W Jones
(74) *Attorney, Agent, or Firm* — HAYNES AND BOONE, LLP

(57) ABSTRACT

Semiconductor structures and methods are provided. A semiconductor structure according to the present disclosure includes a first fin structure and a second fin structure over a substrate, a first source/drain feature disposed over the first fin structure and a second source/drain feature disposed over the second fin structure, a dielectric feature disposed over the first source/drain feature, and a contact structure formed over the first source/drain feature and the second source/drain feature. The contact structure is electrically coupled to the second source/drain feature and is separated from the first source/drain feature by the dielectric feature.

20 Claims, 25 Drawing Sheets

(56) References Cited

U.S. PATENT DOCUMENTS

| | | | |
|---|---|---|---|
| 2014/0134814 A1* | 5/2014 | Wong | H10D 84/017 438/283 |
| 2014/0138779 A1* | 5/2014 | Xie | H01L 29/66553 257/401 |
| 2015/0318398 A1* | 11/2015 | Xie | H10D 64/017 257/288 |
| 2016/0284601 A1* | 9/2016 | Yu | H10D 84/017 |
| 2017/0110577 A1* | 4/2017 | Wang | H10D 84/038 |
| 2017/0352657 A1* | 12/2017 | Bergendahl | H01L 21/823468 |
| 2018/0175165 A1* | 6/2018 | Lim | H01L 29/42376 |
| 2018/0366470 A1* | 12/2018 | Chi | H01L 21/823431 |
| 2019/0148240 A1* | 5/2019 | Xie | H01L 21/76808 257/401 |
| 2019/0164813 A1* | 5/2019 | Wang | H01L 29/0847 |
| 2019/0378909 A1* | 12/2019 | Cheng | H01L 29/6656 |
| 2020/0295002 A1* | 9/2020 | Snyder | H01L 21/3085 |

FOREIGN PATENT DOCUMENTS

| | | |
|---|---|---|
| TW | 201709526 A | 3/2017 |
| TW | 201820634 A | 6/2018 |
| TW | 202011458 A | 3/2020 |
| TW | 202030888 A | 8/2020 |
| TW | 202038332 A | 10/2020 |

\* cited by examiner

OVERHANGING SOURCE/DRAIN CONTACT

PRIORITY DATA

The present application claims the benefit of U.S. Provisional Application No. 63/137,023, entitled "Overhanging Source/Drain Contact," filed Jan. 13, 2021, the entirety of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

In the process of scaling down, efforts are invested in reducing the number of metal lines while maintaining the same connectivity. Some example structures include elongated source/drain contacts that spans over more than one active regions. As a tradeoff, the elongated source/drain contacts may overlap adjacent gate structures, resulting in increased parasitic capacitance between the source/drain contacts and the gate structures. Therefore, while existing source/drain contacts of multi-gate devices are generally adequate for their intended purposes, they are not satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
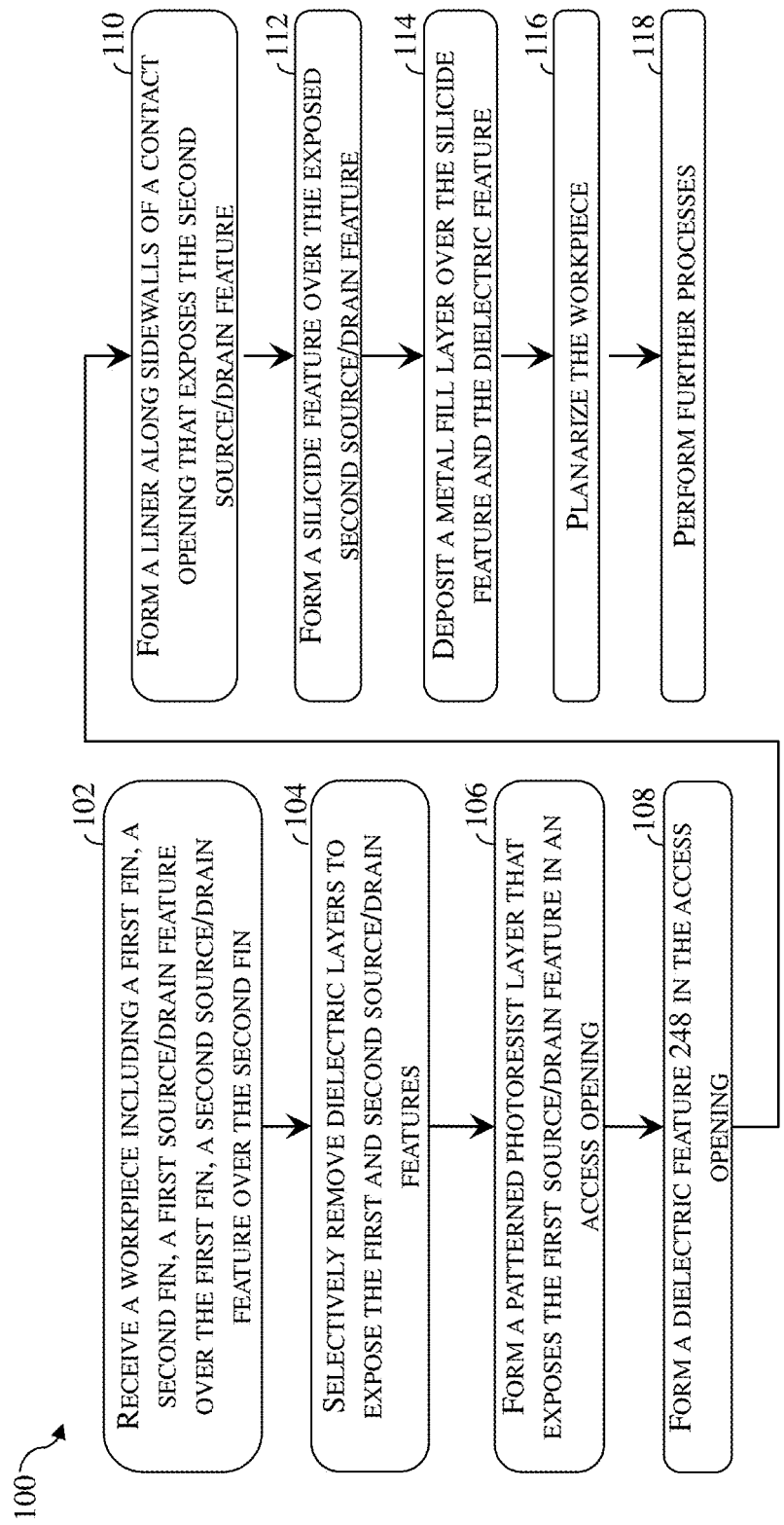
FIG. 1 is a flowchart of a method forming a semiconductor structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In IC design, a plurality of devices may be grouped together as a cell or a standard cell to perform certain circuit functions. Such a cell or a standard cell may perform logic operations, such as NAND, AND, OR, NOR, or inverter, or serve as a memory cell, such as a static random access memory (SRAM) cell. The number of metal lines required to interconnect a cell is a factor to determine the size of the cell, such as a cell height. One way to reduce the cell height is to implement local interconnect structures to relocate contact vias, thereby consolidating connections of contact vias to metal lines. In some existing technology, an elongated source/drain contact may be formed such that a contact via may be coupled to a metal line that is farther away. Contact via relocation allows elimination of one or more metal lines and reduction of the cell height. That technique is not without challenges. For example, the elongated source/drain contact may extend alongside gate structures, leading to increased parasitic capacitance (e.g. gate-to-drain capacitance) and undesirable ring oscillator (RO) performance.

The present disclosure provides a source/drain contact that span over more than one active region, such as a fin element of an FinFET, without increase of parasitic capacitance. The source/drain contact of the present disclosure includes a first portion that couples to a first source/drain feature and a second portion that overhangs or "flies" over a second source/drain feature that is adjacent the first source/drain feature. The second portion is spaced apart from the second source/drain feature by a dielectric feature. The profile of the second portion and the presence of the dielectric feature reduces the areal overlap with adjacent gate structures, thereby reducing parasitic capacitance.

The various aspects of the present disclosure will now be described in more detail with reference to the figures. In that regard, FIG. 1 is a flowchart illustrating a method 100 of forming a semiconductor structure from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2, which illustrates a fragmentary top view of a workpiece 200 as well as FIG. 3-22, which are fragmentary cross-sectional views of workpiece 200 at different stages of fabrication according to embodiments of the method 100 in FIG. 1. Because the workpiece 200 will be fabricated into a semiconductor device, the workpiece 200 may be referred to herein as a semiconductor device 200 as the context requires. For avoidance, the X, Y and Z directions in FIGS. 2-22 are perpendicular to one another. Throughout the present disclosure, like reference numerals denote like features, unless otherwise expressly excepted.

Figure 2:
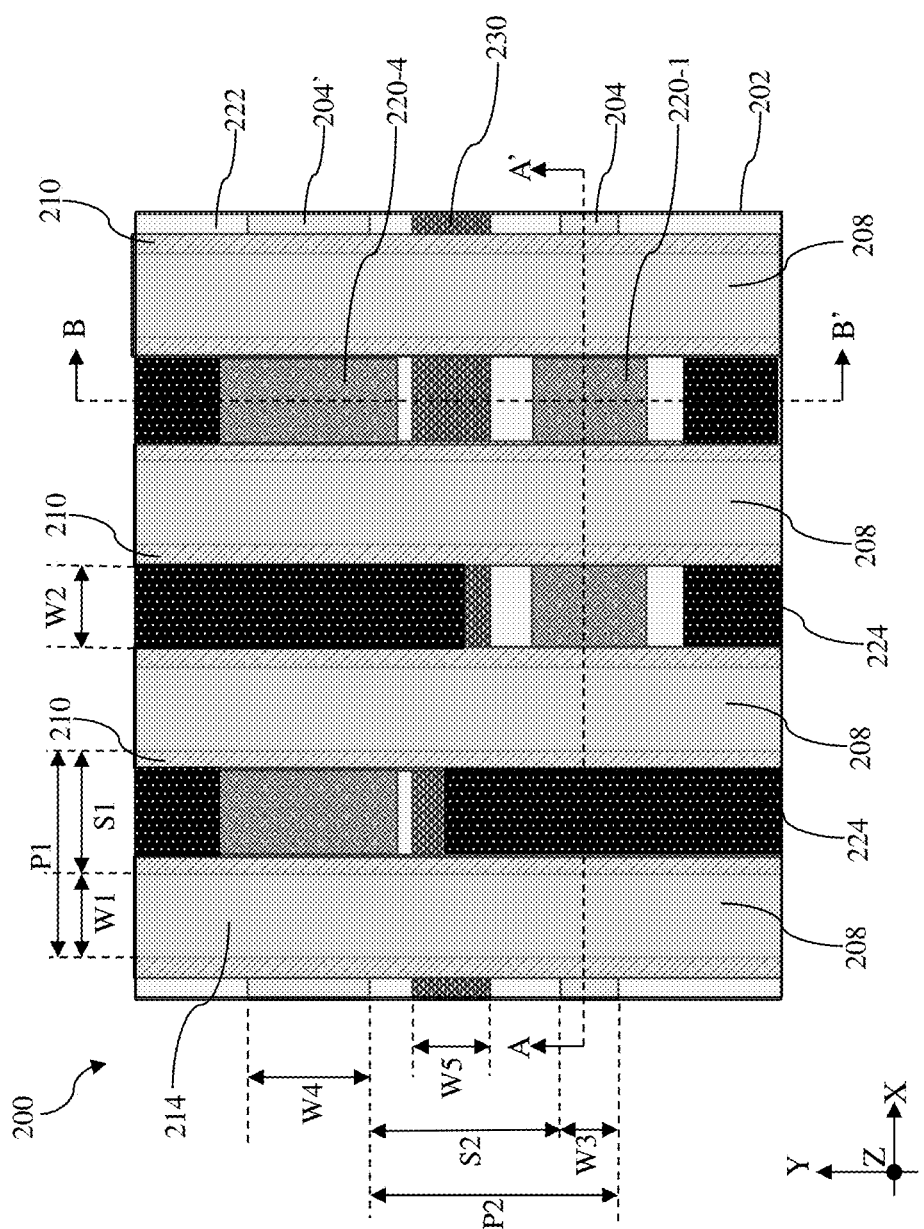
FIG. 2 is a fragmentary top view of a workpiece to undergo fabrication according to the method in FIG. 1, according to one or more aspects of the present disclosure.
Figure 3:
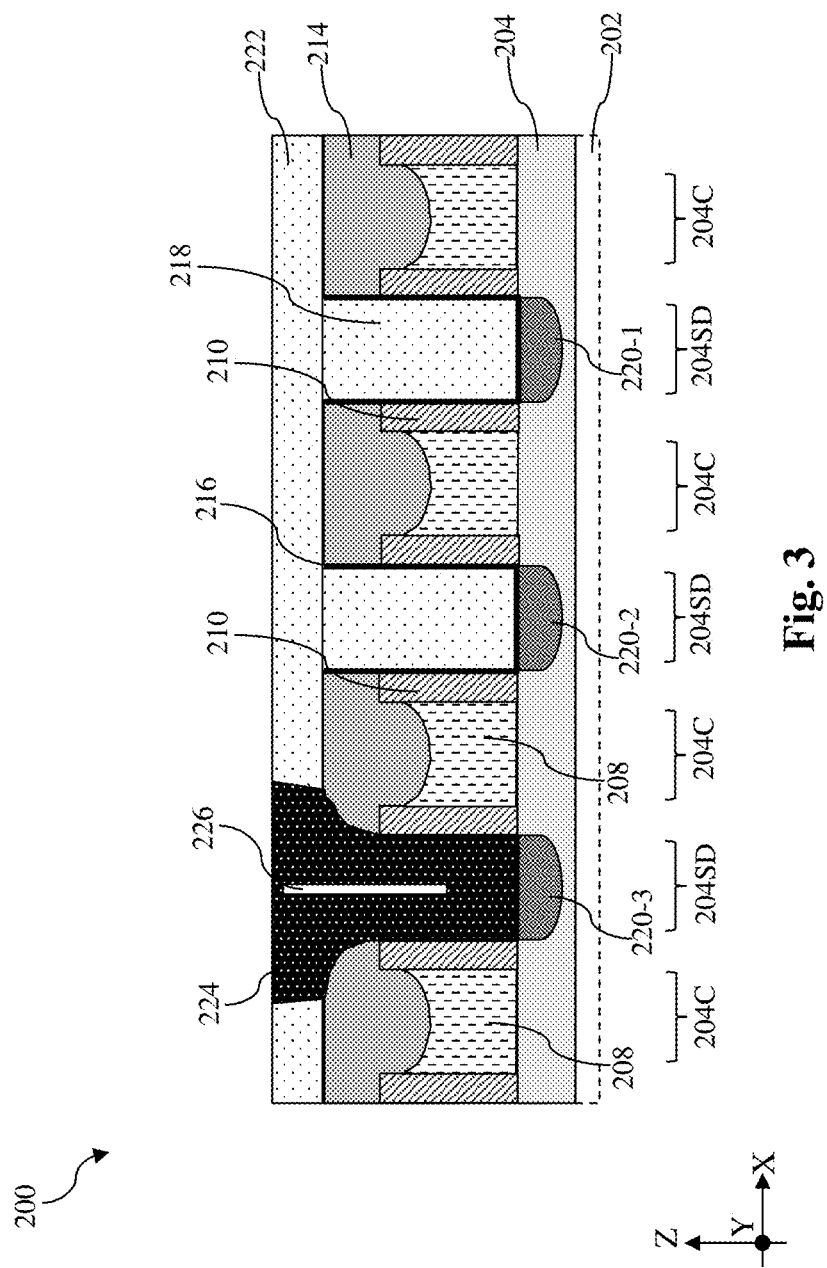
FIGS. 3-22 are fragmentary cross-sectional views of a workpiece at various stages of fabrication according to the method in FIG. 1, according to one or more aspects of the present disclosure.
Figure 4:
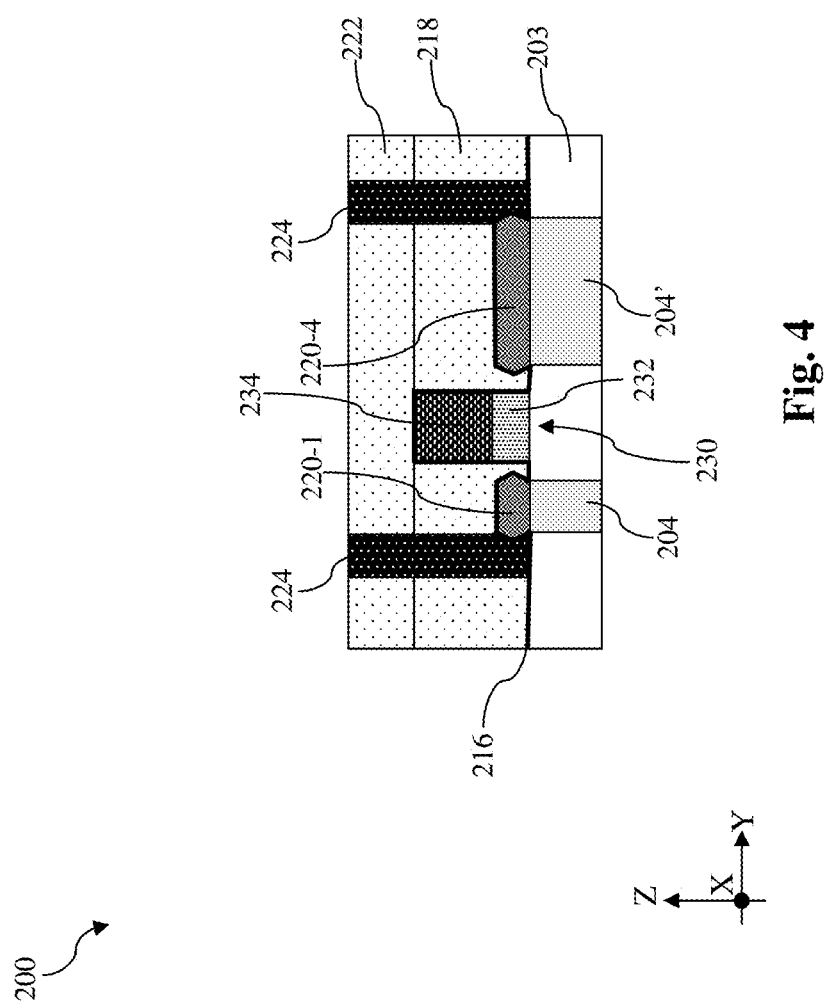

Referring to FIGS. 1, 2, 3, and 4, method 100 includes a block 102 where a workpiece 200 is received. FIG. 2 illustrates a fragmentary top view of the workpiece 200. FIG. 3 illustrates a fragmentary cross-sectional view of the workpiece 200 along line A-A' and FIG. 4 illustrates a fragmentary cross-sectional view of the workpiece 200 along line B-B'. As shown in FIGS. 2 and 4 the workpiece 200 includes a first active region 204 and a second active region 204' over a substrate 202. The substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium (Ge), silicon carbide (SiC), silicon germanium (SiGe), or diamond. Alternatively, the substrate 202 may include a compound semiconductor and/ or an alloy semiconductor. Further, in some embodiments, the substrate 202 may include an epitaxial layer (epi-layer), the substrate 202 may be strained for performance enhancement, the substrate 202 may include a silicon-on-insulator (SOI) structure, and/or the substrate 202 may have other suitable enhancement features.

The first active region 204 and the second active region 204' may include a vertical stack of channel members in case of MBC transistors or may include a fin structure (i.e., a fin, or a fin element) in case of FinFETs. In the depicted embodiments, each of the first active region 204 and the second active region 204' is a fin structure and the semiconductor device 200 may include FinFETs. The first active region 204 and the second active region 204' may include silicon (Si) or another elementary semiconductor, such as germanium (Ge); a compound semiconductor such as silicon carbide (SiC), gallium arsenide (GaAs), gallium phosphide (GaP), indium phosphide (InP), indium arsenide (InAs), and/or indium antimonide (InSb); an alloy semiconductor such as silicon germanium (SiGe), gallium arsenic phosphorus (GaAsP), aluminum indium arsenic (AlInAs), aluminum gallium arsenic (AlGaAs), indium gallium arsenic (InGaAs), gallium indium phosphorus (GaInP), and/or gallium indium arsenic phosphorus (GaInAsP); or combinations thereof. As shown in FIGS. 2 and 3, the first active region 204 and the second active region 204' extend lengthwise along the X direction. The first active region 204 and the second active region 204' may be fabricated using suitable processes including photolithography and etch processes. The photolithography process may include forming a photoresist layer overlying the substrate 202, exposing the photoresist layer to radiation reflected from or transmitting through a photomask, performing post-exposure bake processes, and developing the photoresist layer to form a masking element including the photoresist layer. In some embodiments, patterning the photoresist layer to form the masking element may be performed using an electron beam (e-beam) lithography process. The masking element may then be used to protect regions of the substrate 202 while an etch process forms recesses into the substrate 202, thereby forming the first active region 204 and the second active region 204'. The recesses may be etched using a dry etch (e.g., chemical oxide removal), a wet etch, and/or other suitable processes. Numerous other embodiments of methods to form the active regions (such as the first active region 204 and the second active region 204') on the substrate 202 may also be used. Active regions are separated from one another by an isolation feature 203. The isolation feature 203 may also be referred to as the shallow trench isolation (STI) feature and may include silicon oxide, silicon nitride, silicon oxynitride, fluorine-doped silicate glass (FSG), a low-k dielectric, combinations thereof, and/or other suitable materials.

Referring to FIG. 3, each of the first active region 204 and the second active region 204' includes a channel region 204C wrapped over by a gate structure 208. The first active region 204 includes a source/drain region 204SD, over which a first source/drain feature 220-1 is formed. The second active region 204' includes a source/drain region 204SD, over which a fourth source/drain feature 220-4 is formed. Sidewalls of the gate structure 208 are lined by a gate spacer 210. The gate spacer 210 separates the gate structure 208 from the first source/drain feature 220-1 and the fourth source/drain feature 220-4. The gate structure wraps over the channel region 204C of the first active region 204 and the channel region 204C of the second active region 204'. As illustrated in FIG. 2, the gate structure 208 extends lengthwise along Y direction, which is perpendicular to the X direction. While not explicitly shown in FIG. 2, the gate structure 208 includes an interfacial layer, a gate dielectric layer, one or more work function layers, and a metal fill layer. In some embodiments, the interfacial layer may include a dielectric material such as silicon oxide or silicon hafnium oxide. The gate dielectric layer is formed of a high-k (i.e., dielectric constant greater than about 3.9) dielectric material that may include hafnium oxide (HfO), titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The one or more work function layers may include n-type work function layers and p-type work function layers. Example n-type work function layers may be formed of aluminum, titanium aluminide, titanium aluminum carbide, tantalum silicon carbide, tantalum silicon aluminum, tantalum silicon carbide, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co), nickel (Ni), or copper (Cu). Because the gate dielectric layer is formed of high-k dielectric material and the use of metal in the gate structure 208, the gate structure 208 may also be referred to the high-k metal gate structure 208 or metal gate structure 208.

As shown in FIG. 2, the workpiece 200 may include a plurality of gate structures 208 that extend lengthwise along the Y direction. Each of the gate structures 208 include a first width W1 along the X direction and is spaced apart from an adjacent gate structure by a first spacing S1. The gate structures 208 are disposed at a first pitch P1. In some embodiments, the first width W1 is between about 5 nm and about 80 nm, the first spacing S1 is between about 10 nm and about 200 nm, and the first pitch P1 is between about 15 nm and about 280 nm. The ranges of the first width W1, the first spacing S1, and the first pitch P1 are selected to minimize the device dimensions in consideration of the limitations of the photolithography processes and the production cost. In some embodiments represented in FIG. 2, the first active region 204 and the second active region 204' may have similar or different widths along the Y direction. In the depicted embodiment, the first active region 204 has a third width W3 and the second active region 204' has a fourth width W4 greater than the third width W3. The wider width of the second active region 204' may allow a transistor over the second active region 204' to have a greater On-state current and the smaller width of the first active region 204 may allow a transistor over the first active region 204 to have a smaller leakage. In one embodiment, the workpiece 200 is for fabrication of a static random access memory (SRAM) device, the first active region 204 is for formation of a p-type transistor and a the second active region 204' is for formation of an n-type transistor. In some instances, the third width W3 is between about 5 nm and about 100 nm and the fourth width W4 is between about 5 nm and about 100 nm. In the depicted embodiment, the first active region 204 and the second active region 204' may be separated by a second spacing S2 and may be disposed at a second pitch P2. In some embodiments, the second spacing S2 may be between about 20 nm and about 200 nm and the second pitch P2 may be between about 25 nm and about 300 nm. The ranges of the third width W3, the fourth width W4, the second spacing S2, and the second pitch P2 are selected to minimize the device dimensions in consideration of the limitations of the photolithography processes and the production cost. The ranges of the first width W1, the first spacing S1, the first pitch P1, the third width W3, the fourth width W4, the second spacing S2, and the second pitch P2 may appear wide because the semiconductor devices fabricated on the workpiece 200 may be small and densely packed logic devices, densely packed memory devices, relatively large electrostatic discharge (ESD), or relatively large input/output (I/O) devices.

The gate spacer 210 shown in FIGS. 2 and 3 may be a single layer or a multi-layer. Example materials for the gate spacer 210 include silicon oxide, silicon nitride, silicon carbide, silicon oxynitride, silicon carbonitride, silicon oxycarbide, silicon oxycarbonitride, and/or combinations thereof. In one example, the gate spacer 210 is formed of silicon nitride. As shown in FIG. 3, when viewed along the Y direction, sidewalls of each of the gate structures 208 are lined by the gate spacer 210 such that each of the gate structures 208 is sandwiched between two gate spacers 210. Each of the gate structures 208 and the gate spacers 210 sandwiching it are capped by a self-aligned capping (SAC) layer 214. The SAC layer 214 may be formed of hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yittrium oxide, tantalum carbonitride, silicon nitride, silicon oxycarbonitride, silicon, zirconium nitride, or silicon carbonitride. In one embodiment, the SAC layer 214 is formed of silicon nitride.

The source/drain feature shown in FIGS. 2-4, including the first source/drain feature 220-1, a second source/drain feature 220-2, a third source/drain feature 220-3, and the fourth source/drain feature 220-4, may be epitaxially grown over the source/drain regions 204SD of the active regions, such as the first active region 204 and the second active region 204'. Depending on the device types and design requirements, the source/drain features of the present disclosure may be n-type or p-type. For example, n-type source/drain features may include silicon (Si) doped with an n-type dopant, such as phosphorous (P) or arsenic (As) and p-type source/drain features may include silicon germanium (SiGe) doped with a p-type dopant, such as boron (B), boron difluoride ($BF_2$), or gallium (Ga). As shown in FIG. 3, the first source/drain feature 220-1, the second source/drain feature 220-2, and the third source/drain feature 220-3 are disposed over source/drain regions 204SD of the first active region 204. The fourth source/drain feature 220-4 is disposed over the source/drain region 204SD of the second active region 204', as shown in FIGS. 2 and 4. In some embodiments represented in FIGS. 2 and 4, the first active region 204 and the second active region 204' may have different widths along the Y direction and that may result in different widths of the first source/drain feature 220-1 and the fourth source/drain feature 220-4. In the depicted embodiment, a p-type FinFET may be formed over a narrower first active region 204 and an n-type FinFET may be formed over a wider second active region 204' to increase the drive current of the n-type FinFET. In this embodiment, the fourth source/drain feature 220-4 is wider than the first source/drain feature 220-1 along the Y direction.

Referring to FIGS. 2 and 4, a dielectric fin 230 may be disposed between the first active region 204 and the second active region 204'. The dielectric fin 230 is also disposed between the first source/drain feature 220-1 and the fourth source/drain feature 220-4. One of the functions of the dielectric fin 230 is to prevent merging of the first source/drain feature 220-1 and the fourth source/drain feature 220-4 during their epitaxial growth. In some embodiments represented in FIG. 4, the dielectric fin 230 may include a first layer 232 and a second layer 234 over the first layer 232. The first layer 232 and the second layer 234 may have different compositions. In some instances, the first layer 232 may include silicon oxide, silicon oxycarbonitride or silicon carbonitride and the second layer 234 may include silicon nitride, aluminum oxide, zirconium oxide, hafnium oxide, a metal oxide, or a suitable dielectric material. A dielectric constant of the second layer 234 may be greater than a dielectric constant of the first layer 232. As shown in FIG. 4, a top surface of the dielectric fin 230 is higher than top surfaces of the first source/drain feature 220-1 and the fourth source/drain feature 220-4 along the Z direction. In some embodiments, the dielectric fin 230 may have a fifth width W5 that is between about 5 nm and about 100 nm. The fifth width W5 of the dielectric fin 230 largely depends on the region the dielectric fin 230 is deployed. When implemented in a densely packed logic device region or memory device region, the dielectric fin 230 may have relatively small width. When implemented in an ESD device region or an I/O device region, the dielectric fin 230 may have much larger width.

The workpiece 200 further includes a contact etch stop layer (CESL) 216 over the source/drain features (including the first source/drain feature 220-1, the second source/drain feature 220-2, the third source/drain feature 220-3, and the fourth source/drain feature 220-4), a first interlayer dielectric (ILD) layer 218 over the CESL 216, and a second ILD layer 222 over the first ILD layer 218. As shown in FIG. 3, the CESL 216 is in contact with the top surfaces of source/drain features (including the first source/drain feature 220-1, the second source/drain feature 220-2, the third source/drain feature 220-3, and the fourth source/drain feature 220-4), sidewalls of the gate spacers 210, and sidewalls of the SAC layer 214. The first ILD layer 218 is separated from the source/drain features (including the first source/drain feature 220-1, the second source/drain feature 220-2, the third source/drain feature 220-3, and the fourth source/drain feature 220-4), the gate spacers 210, and the SAC layer 214 by the CESL 216. The CESL 216 may include a nitrogen-containing dielectric material. In some instances, the CESL 216 may include silicon nitride or silicon carbonitride. The first ILD layer 218 and the second ILD layer 222 may include silicon oxide or a low-k dielectric material with a k-value (dielectric constant) smaller than that of silicon oxide, which is about 3.9. In some examples, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof.

To provide compartmentalization of to-be-formed source/drain contacts, the workpiece 200 may also include a plurality of contact cut features 224. As shown in FIGS. 3 and 4, each of the contact cut features 224 rises above top surfaces of the SAC layers 214. The contact cut features 224 may have a composition different from that of the first ILD layer 218 and the second ILD layer 222 to allow selective etching of the first ILD layer 218 and the second ILD layer 222. In some embodiments, the contact cut features 224 may include silicon nitride, silicon oxynitride, silicon oxycarbide, silicon oxycarbonitride, silicon carbide, aluminum oxide, hafnium oxide, or a combination thereof. In some embodiments represented in FIG. 3, a portion of the contact cut feature 224 may extend over top surfaces of adjacent SAC layers 214. The contact cut features 224 may deposited using atomic layer deposition (ALD) or flowable chemical vapor deposition (FCVD). In some implements where the contact cut features 224 are formed using ALD, a contact cut feature 224 may include a seam 226 due to premature merging of dielectric material over the seam 226. While the seam 226 is shown to be sealed after a planarization process, as shown in FIG. 3, the seam 226 may be open after a planarization that follows the deposition of the second ILD layer 222. In some instances, the contact cut features 224 may be seam-free. The contact cut features 224 are also shown in FIG. 2 and may have a second width W2 along the X direction. It is noted, while the contact cut features 224 in FIG. 2 appear to be coterminous with two adjacent gat spacers 210 disposed along two adjacent gate structures 208, a top portion of each of the contact cut features 224 may span over the gate spacers 210 and the SAC layer 214 as shown in FIG. 3. In some instances, the second width W2 may be between about 10 nm and about 190 nm. As shown in FIGS. 2 and 3, each of the contact cut features 224 extends lengthwise along the Y direction, in parallel with the gate structures 208. According to the present disclosure, top surfaces of the contact cut features 224 are coplanar with the second ILD layer 222 and higher than top surfaces of the SAC layer 214 to ensure that the contact cut features 224 function to separate source/drain contacts into segments. Without the contact cut features 224, source/drain contacts deposited over source/drain features may extend continuously along the Y direction, resulting in undesirable connections in view of the design.

Figure 5:
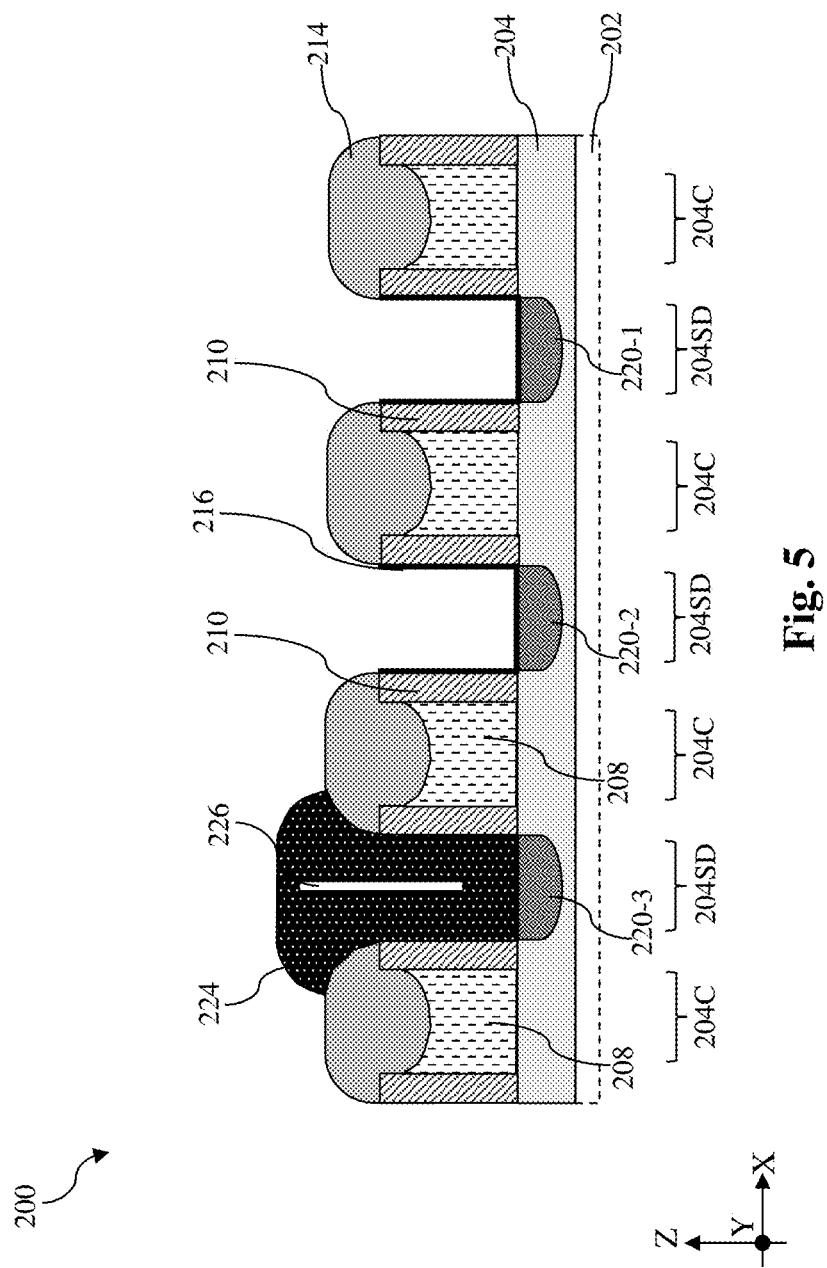
Figure 6:
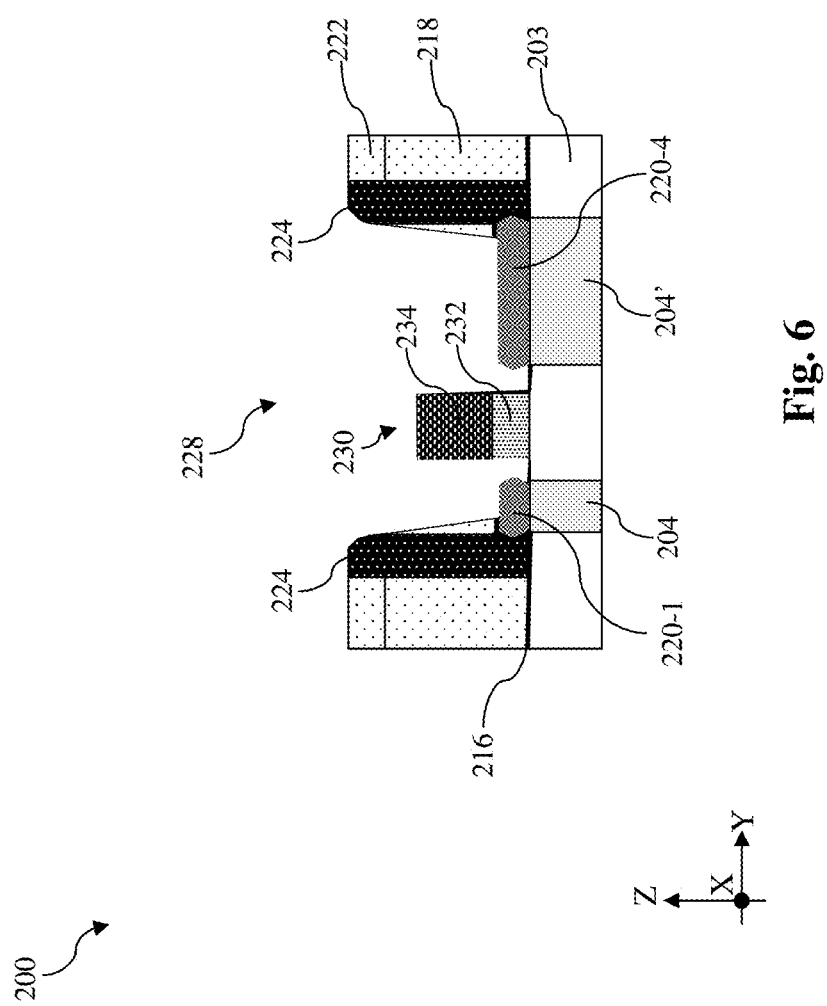

Referring to FIGS. 1, 5 and 6, method 100 includes a block 104 where the first ILD layer 218 and the second ILD layer 222 are removed to expose the source/drain features. In some embodiments, at block 104, the workpiece 200 is dry-etched using a patterned photoresist layer as an etch mask to etch the first ILD layer 218 and the second ILD layer 222 to form a contact opening 228. An example dry etch process at block 104 may implement oxygen, an oxygen-containing gas, hydrogen, a fluorine-containing gas (e.g., $CF_4$, $SF_6$, $NF_3$, $BF_3$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIGS. 5 and 6, the etch process at block 104 may be selective to the first ILD layer 218 and the second ILD layer 222 and etches the source/drain features (including the first source/drain feature 220-1, the second source/drain feature 220-2, the third source/drain feature 220-3, and the fourth source/drain feature 220-4), the contact cut features 224, and the dielectric fin 230 at a slower rate. At the conclusion of the operations at block 104, a portion of the first source/drain feature 220-1, a portion of the fourth source/drain feature 220-4, and the dielectric fin 230 are exposed in the contact opening 228. In some implementations illustrated in FIG. 6, portions of the CESL 216 over the first source/drain feature 220-1 and the fourth source/drain feature 220-4 are also removed.

Figure 7:
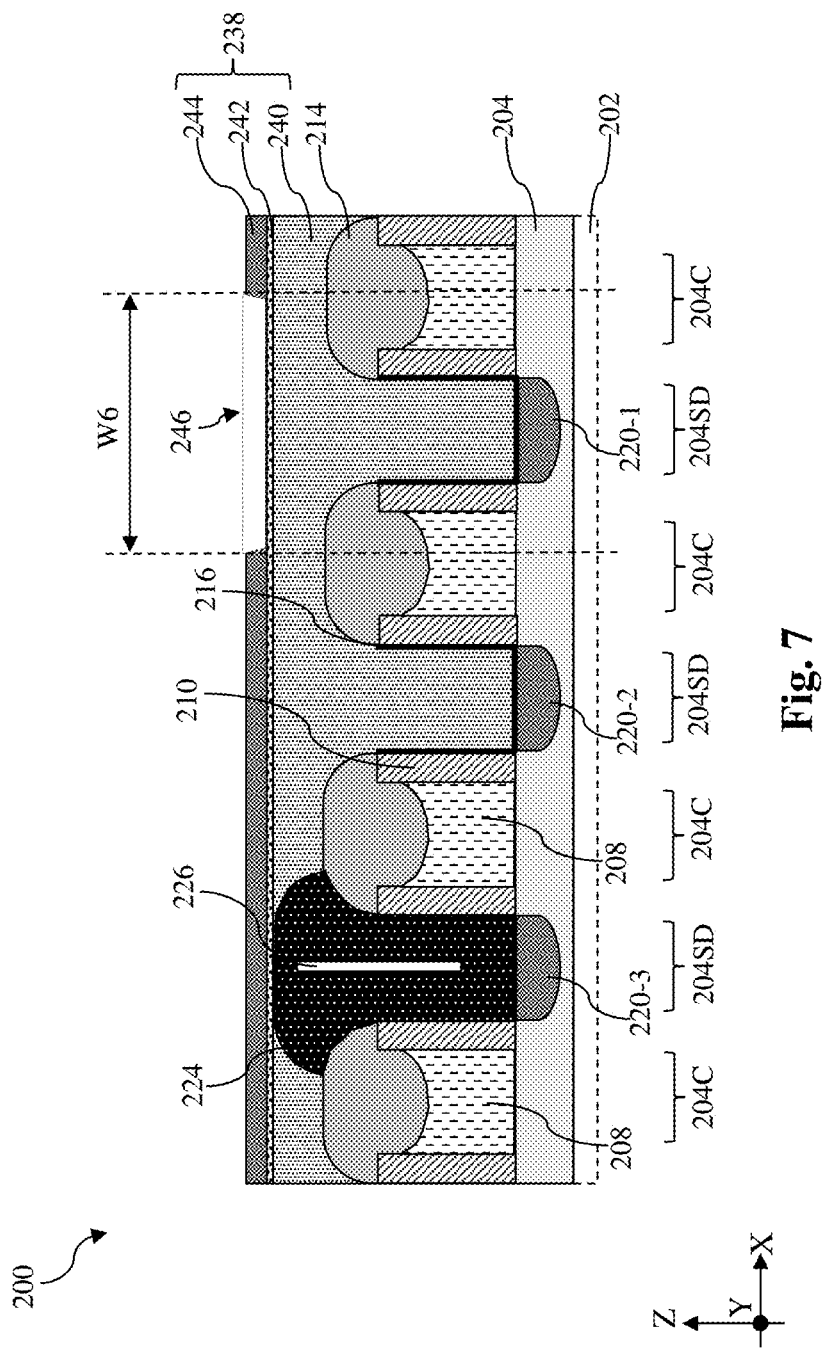
Figure 8:
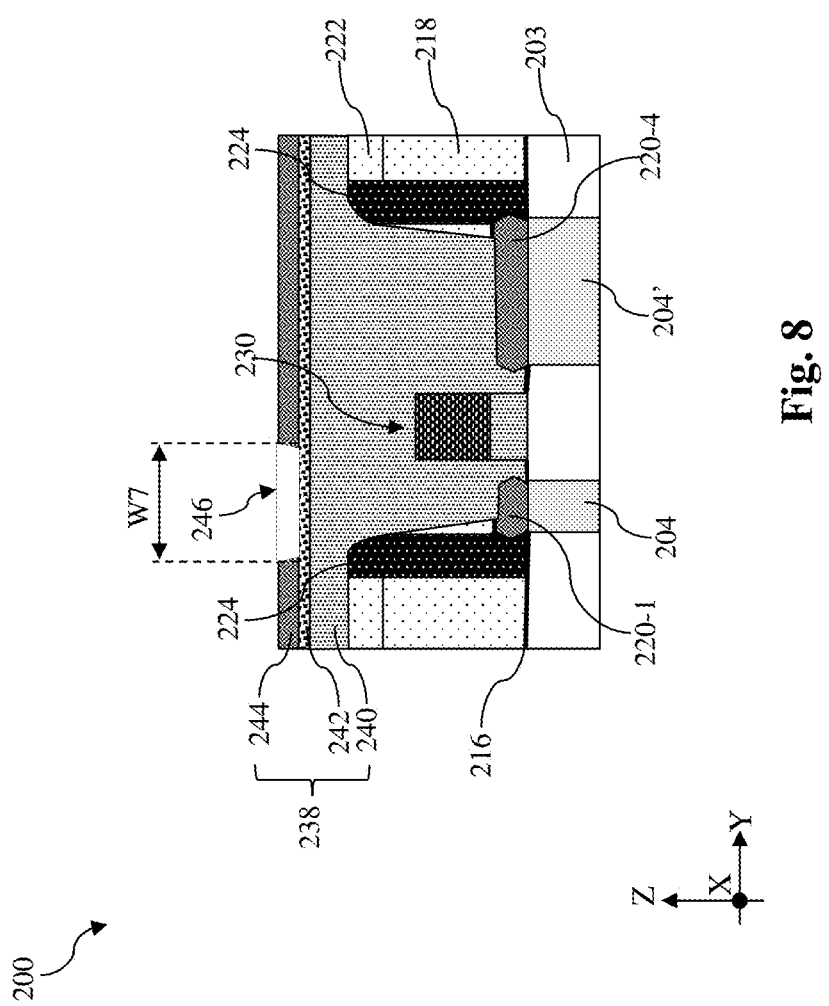
Figure 9:
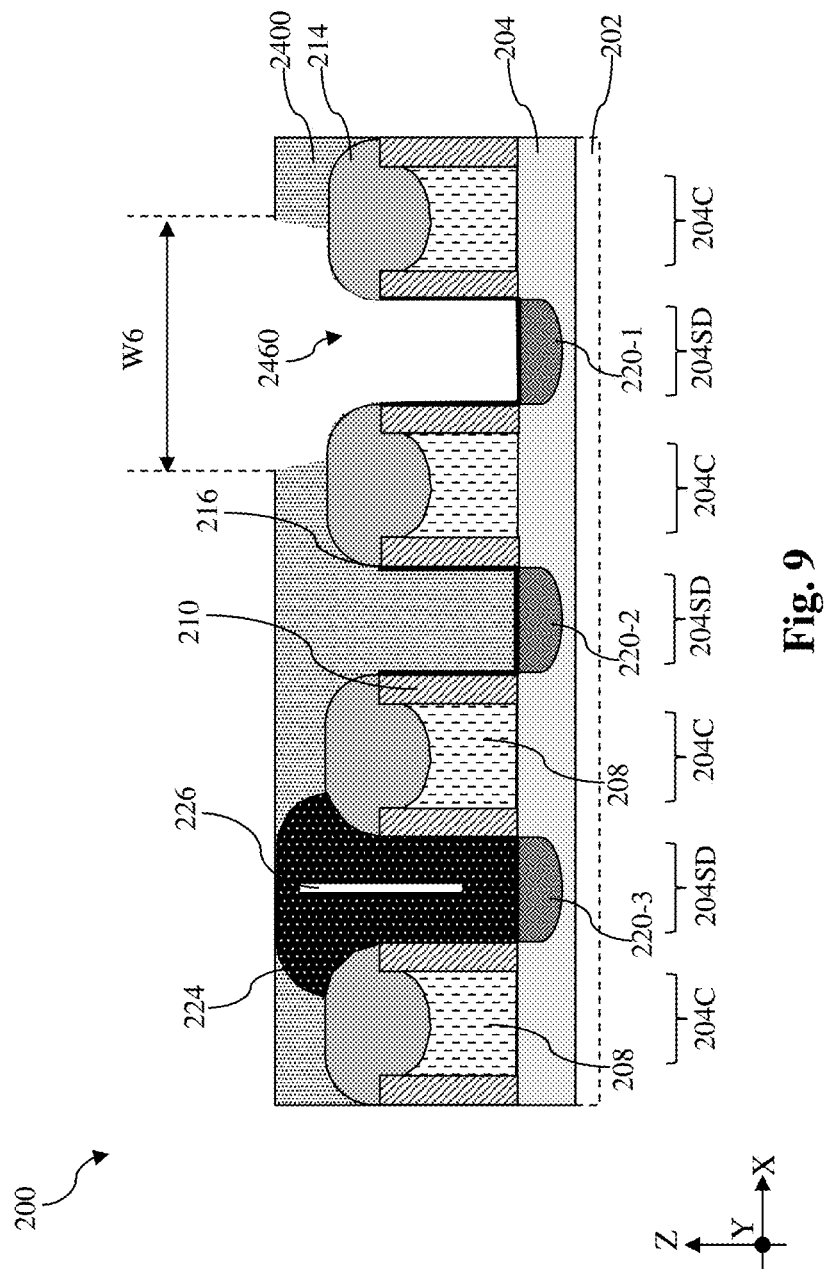
Figure 10:
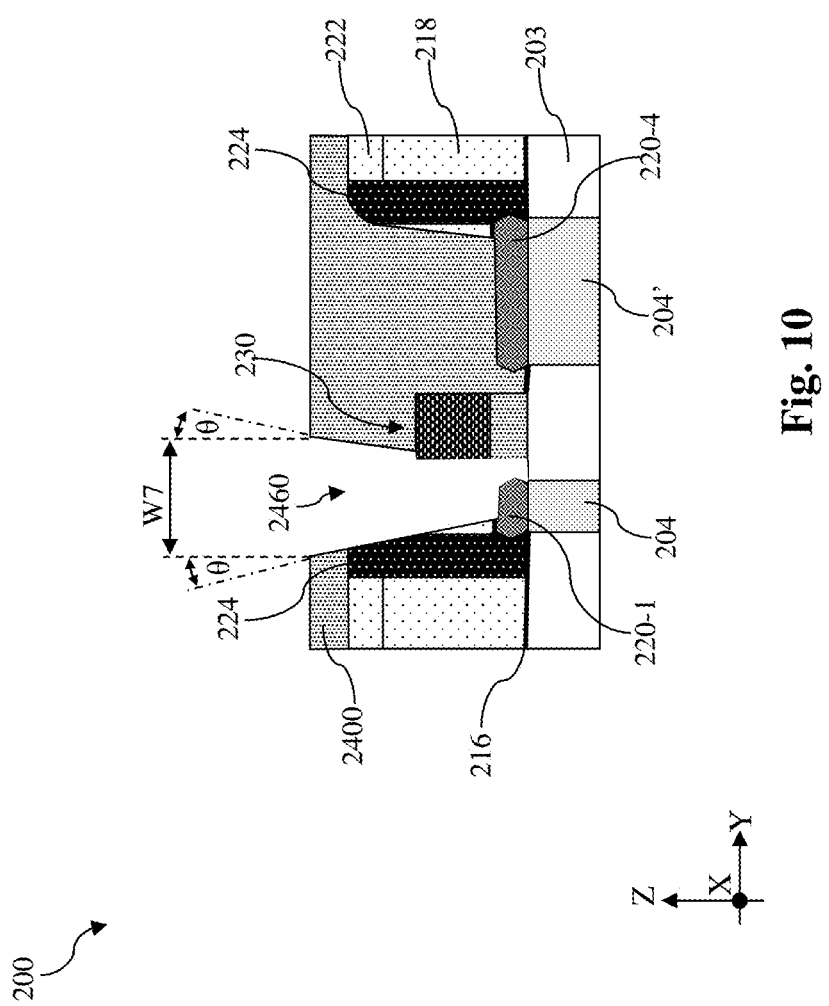

Referring to FIGS. 1, 7, 8, 9, and 10, method 100 includes a block 106 where a patterned photoresist layer 2400 is formed. In an example process, a photoresist layer 238 may be deposited over the workpiece 200. The photoresist layer 238 may be a single layer or a multi-layer. In some embodiments represented in FIGS. 7 and 8, the photoresist layer 238 is a tri-layer and may include a bottom layer 240, a middle layer 242 over the bottom layer 240, and a top layer 244 over the middle layer 242. In one embodiment, the bottom layer 240 may be a carbon-rich polymer layer that includes carbon (C), hydrogen (H) and oxygen, the middle layer 242 may be a silicon-rich polymer layer including silicon (Si), carbon (C), hydrogen (H), and oxygen (O), and the top layer 244 may be photosensitive polymer layer that includes carbon (C), hydrogen (H) and oxygen (O), and a photosensitive component. To pattern the photoresist layer 238, the top layer 244 is first exposed to a radiation reflected from or transmitting through a photomask, baked in a post-exposure bake process, developed in a development process, and rinsed. The pattern of photomask is thereby transferred to the top layer 244 to form a patterned top layer 244 that includes an opening 246 over the first source/drain feature 220-1, as shown in FIGS. 7 and 8. According to the present disclosure, the opening 246 is directly over the first source/drain feature 220-1 and has an areal projection greater than the first source/drain feature 220-1. That is, portions of the opening 246 vertically overlap the contact cut feature 224, the dielectric fin 230, and the SAC layer 214 over adjacent gate structures 208. Although the opening 246 is depicted in FIG. 7 as being over only one the first source/drain feature 220-1, the opening 246 may extend over multiple source/drain features along the X direction and may have an elongated shape. In some embodiments, the opening 246 includes a sixth width W6 along the X direction (shown in FIG. 7) and a seventh width W7 along the Y direction (shown in FIG. 8). The sixth width W6 is greater than the X-direction dimension of the first source/drain feature 220-1 and the seventh width W7 is greater than the Y-direction dimension of the second source/drain feature 220-1. In some instances, the sixth width W6 may be between about 20 nm and about 10 um (i.e., 10000 nm) and the seventh width W7 may be between about 15 nm and about 300 nm. Referring to FIGS. 9 and 10, the patterned top layer 244 is used as an etch mask to etch the middle layer 242 and the bottom layer 240 to form a patterned photoresist layer 2400. The patterned photoresist layer 2400 includes an access opening 2460 that exposes the first source/drain feature 220-1. In the depicted embodiment, the access opening 2460 may have a tapered side profile such that the access opening 2460 has a top opening (having the seventh width W7) wider than a bottom opening adjacent the first source/drain feature 220-1. In some instances, the access opening 2460 is characterized by a tapering angle θ between about 0° and about 30°. As shown in FIG. 10, the second source/drain feature 220-2 and the fourth source/drain feature 220-4 remain covered by the patterned photoresist layer 2400.

Figure 11:
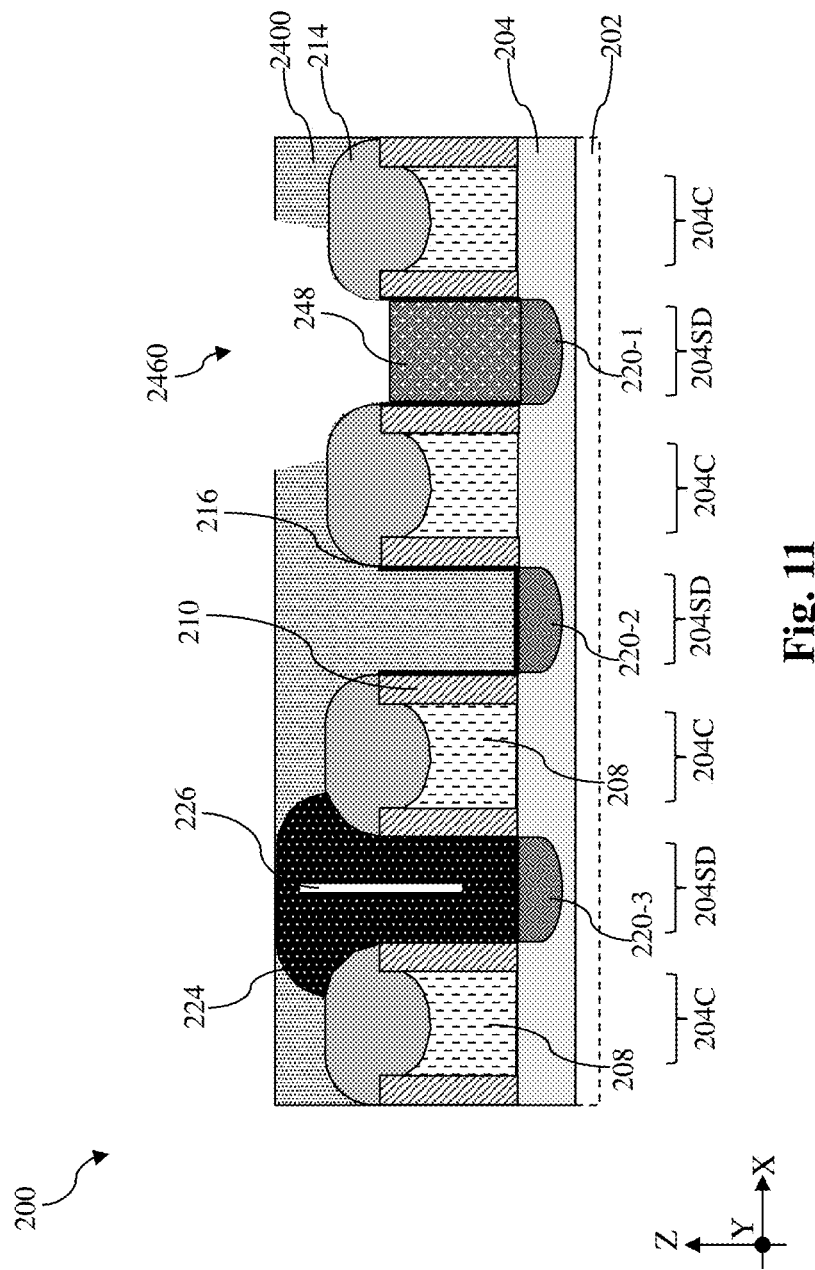
Figure 12:
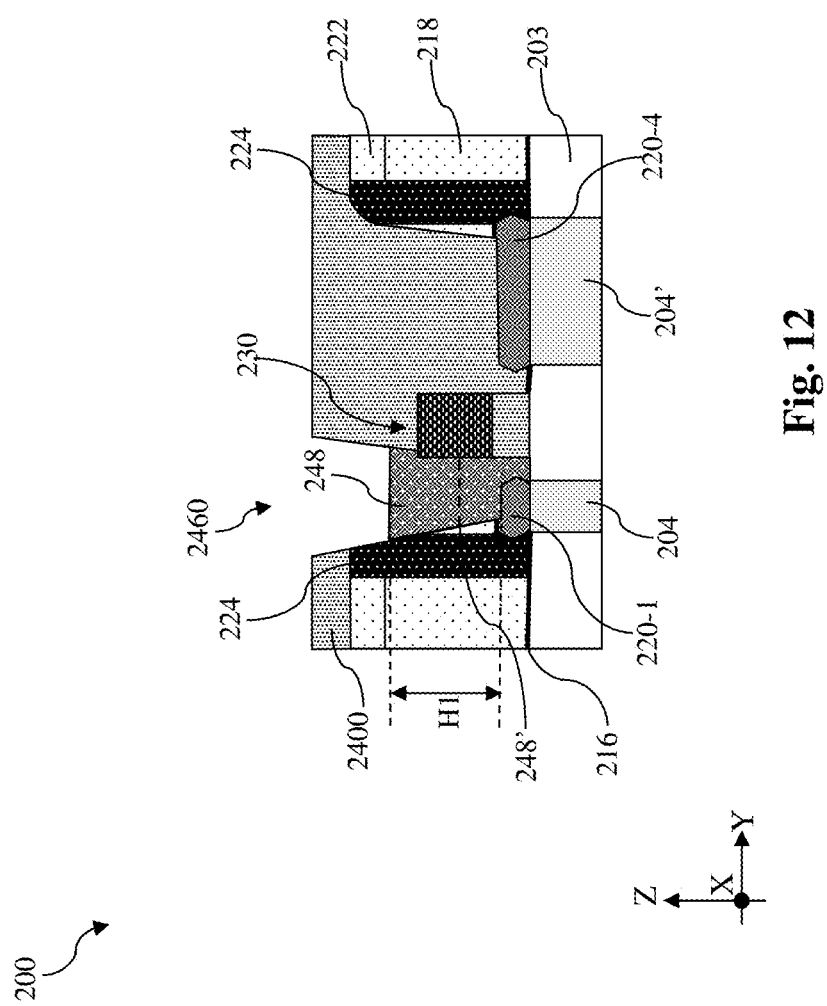

Referring to FIGS. 1, 11 and 12, method 100 includes a block 108 where a dielectric feature 248 is formed in the access opening 2460. In some embodiments, a dielectric material is first deposited in the access opening 2460 using CVD, FCVD, or ALD. The dielectric material may include silicon oxide, silicon nitride, silicon oxynitride, silicon oxycarbide, silicon oxycarbonitride, or a combination thereof. In one embodiment, the dielectric material for the dielectric feature 248 includes silicon oxide. The deposited dielectric material is then etched back to form the dielectric feature 248. As shown in FIG. 12, while a top surface of the dielectric feature 248 is lower than a top surface of the contact cut feature 224, it may be higher than a top surface of the dielectric fin 230. In some alternative embodiment also shown in FIG. 12, the dielectric feature 248 may have an alternative top surface 248' lower than the top surface of the dielectric fin 230. As shown in FIG. 11, when viewed along the Y direction, the dielectric feature 248 is disposed between two gate spacers 210 and is disposed at least partially on the first source/drain feature 220-1. Referring to FIG. 12, when viewed along the X direction, the dielectric feature 248 comes in direct contact with an adjacent contact cut feature 224 and extends along sidewalls of the dielectric fin 230 that separates the first source/drain feature 220-1 and the fourth source/drain feature 220-4. In the depicted embodiments, the dielectric feature 248 lands on both the isolation feature 203 and the first source/drain feature 220-1. As measured from a top surface of the first source/drain feature 220-1, the dielectric feature 248 has a first height H1. A top surface of the dielectric feature is lower than a top surface of the contact cut feature 248 to allow source/drain contact feature to extend over the dielectric feature 248. In some embodiments, the first height H1 may be between about 5 nm and about 50 nm. The top surface of the contact cut feature 224 is higher than the top surface of the dielectric feature 248 by between about 5 nm and about 65 nm. As measured from a top surface of the first source/drain feature 220-1, a height of the contact cut feature 224 may be between about 10 nm and about 70 nm.

Figure 13:
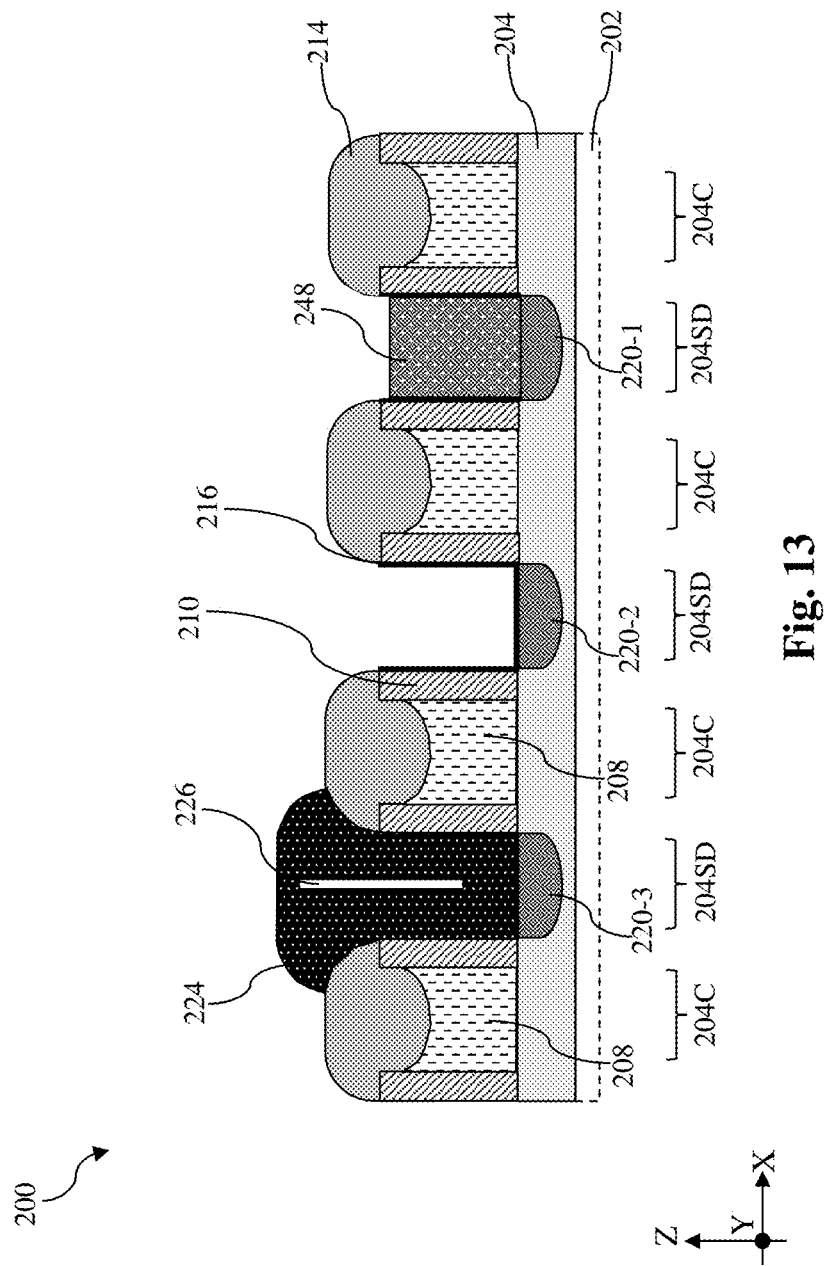
Figure 14:
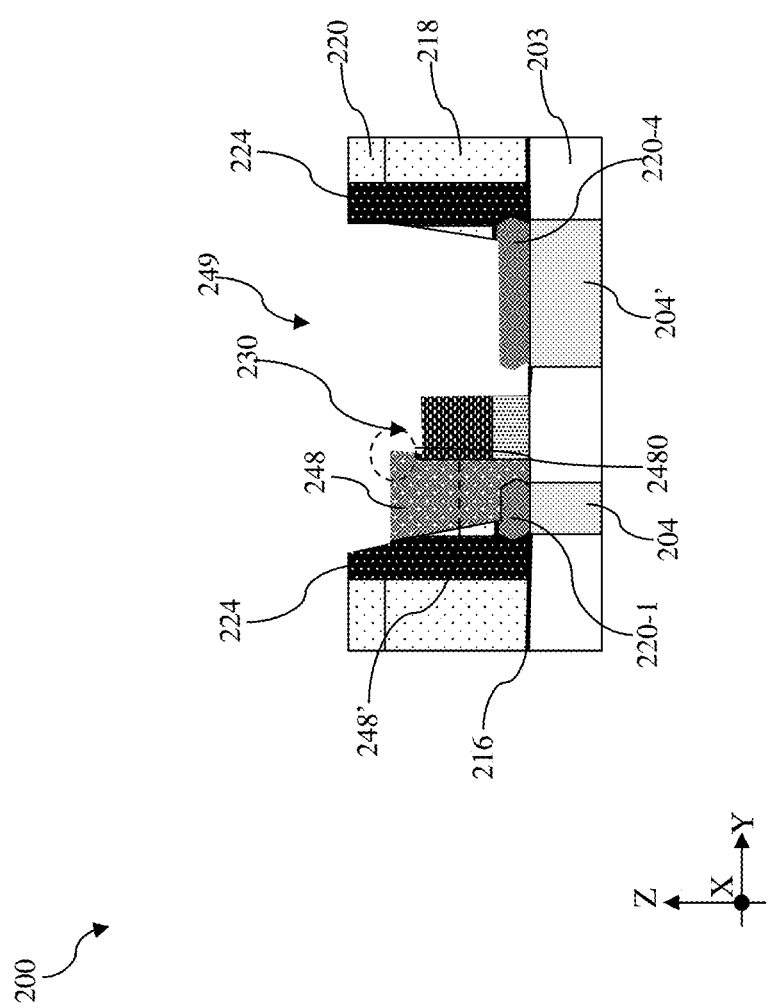

After the formation of the dielectric feature 248, the patterned photoresist layer 2400 is removed by etching, ashing, or a suitable method, as shown in FIGS. 13 and 14. The removal of the patterned photoresist layer 2400 leaves behind a contact opening 249 that exposes the fourth source/drain feature 220-4. When viewed along the X direction, the contact opening 249 is defined between two contact cut features 224, one of them is adjacent the first source/drain feature 220-1 and the other is adjacent the fourth source/drain feature 220-4. As shown in FIG. 14, the dielectric feature 248 and the dielectric fin 230 are exposed in the contact opening 249 and form the shape of the contact opening 249. A profile of the dielectric feature 248 generally tracks the tapered side profile of the access opening 2460 shown in FIG. 10. As a result, the dielectric feature 248 may include an edge portion 2480 that slightly overhangs the dielectric fin 230. Depending on the tapering angle and the seventh width W7, the edge portion 2480 may overhang the dielectric fin 230 by about 0 nm to about 100 nm when the top surface of the dielectric feature 248 is higher than the top surface of the dielectric fin 230.

Figure 15:
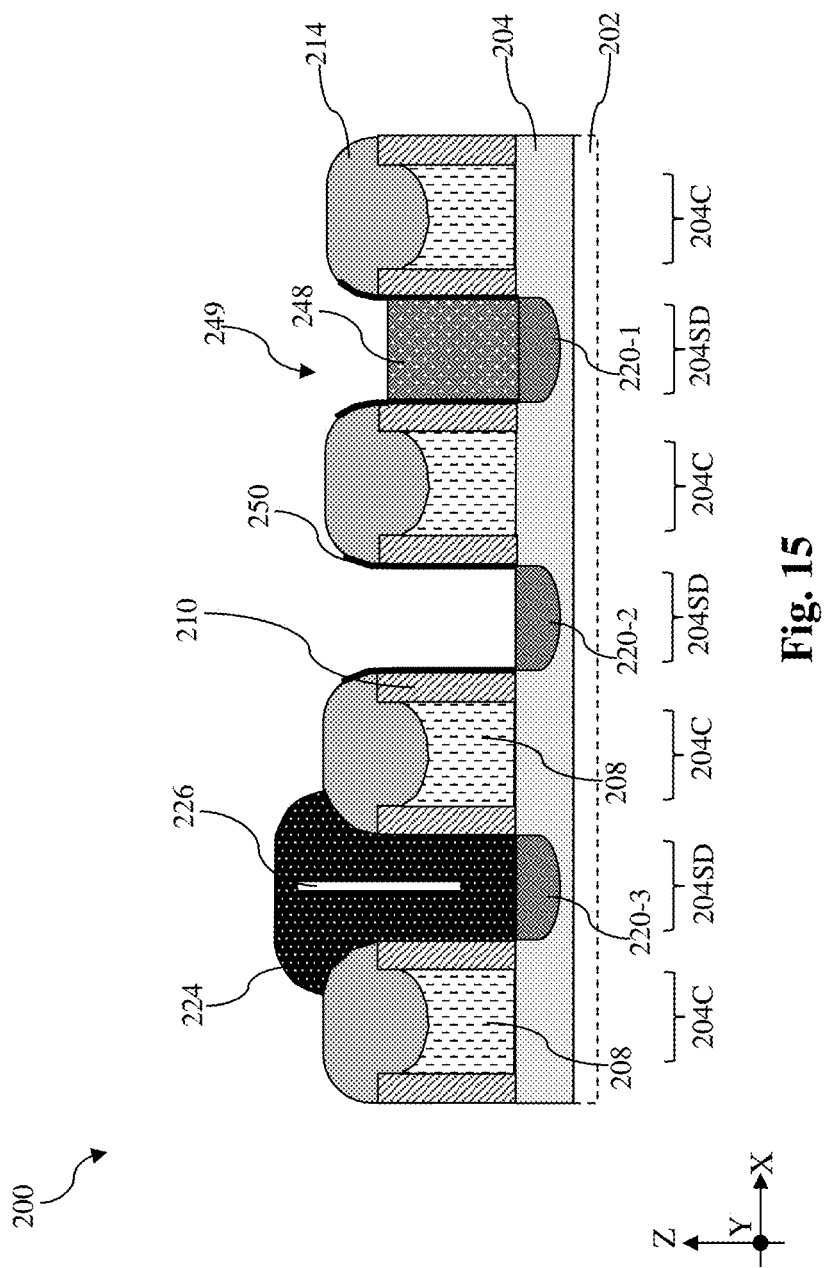
Figure 16:
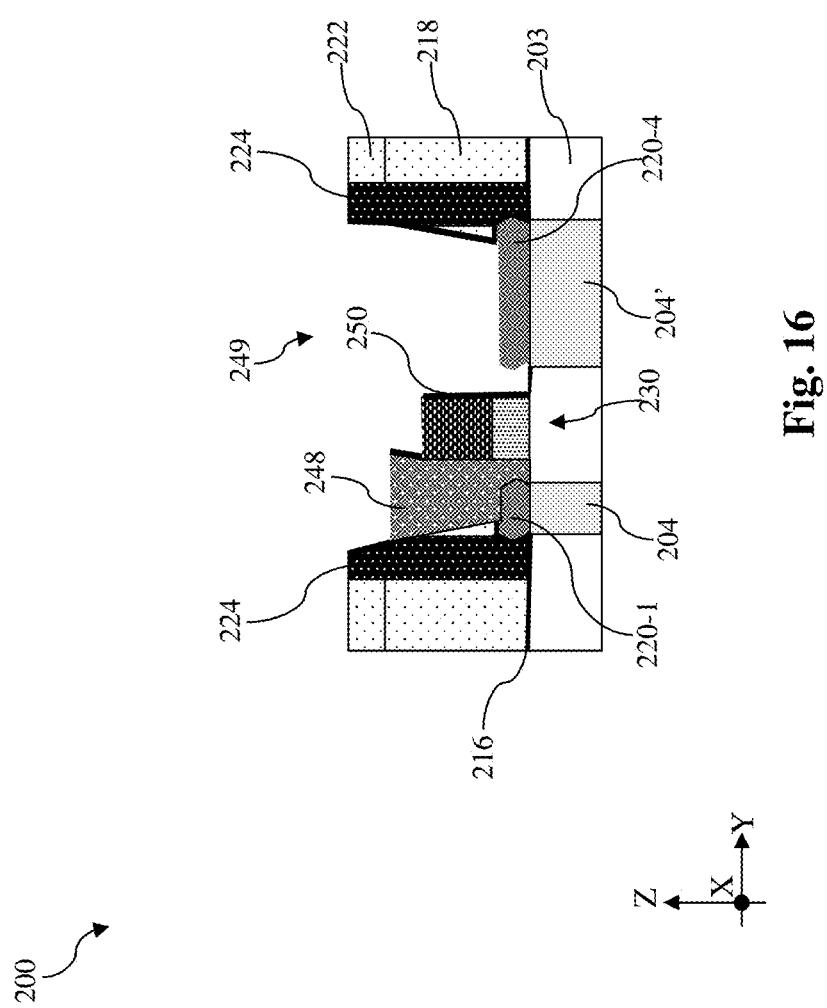

Referring to FIGS. 1, 15 and 16, method 100 includes a block 110 where a liner 250 is formed along sidewalls of a contact opening 249. In an example process, a liner material is conformally deposited over the workpiece 200. The liner material may include silicon nitride (SiN) or a suitable nitrogen-containing dielectric material. Thereafter, the deposited liner material is etched back to remove the liner material on top-facing surfaces to form the liner 250 along sidewalls of the contact opening 249, including sidewalls of the dielectric fin 230, sidewalls of the dielectric feature 248, and sidewalls of the contact cut features 224.

Figure 17:
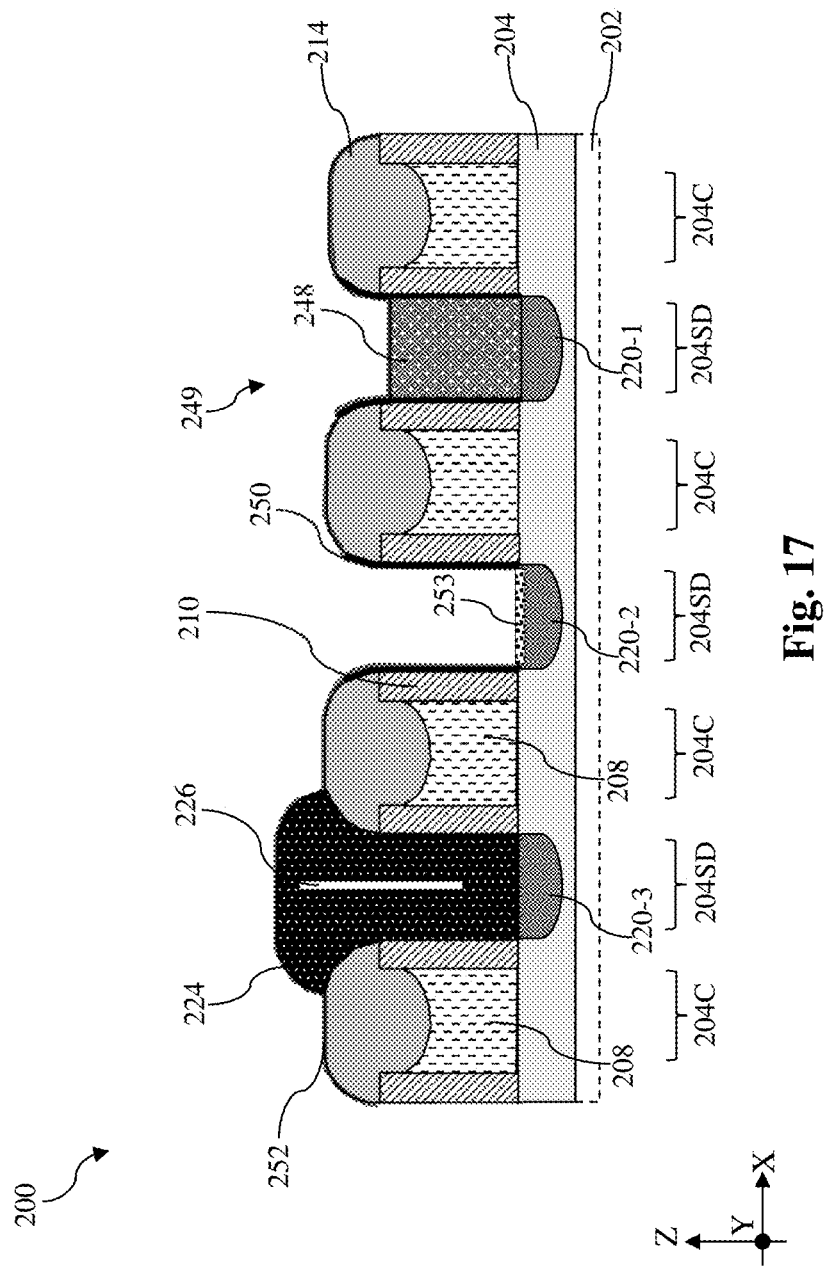
Figure 18:
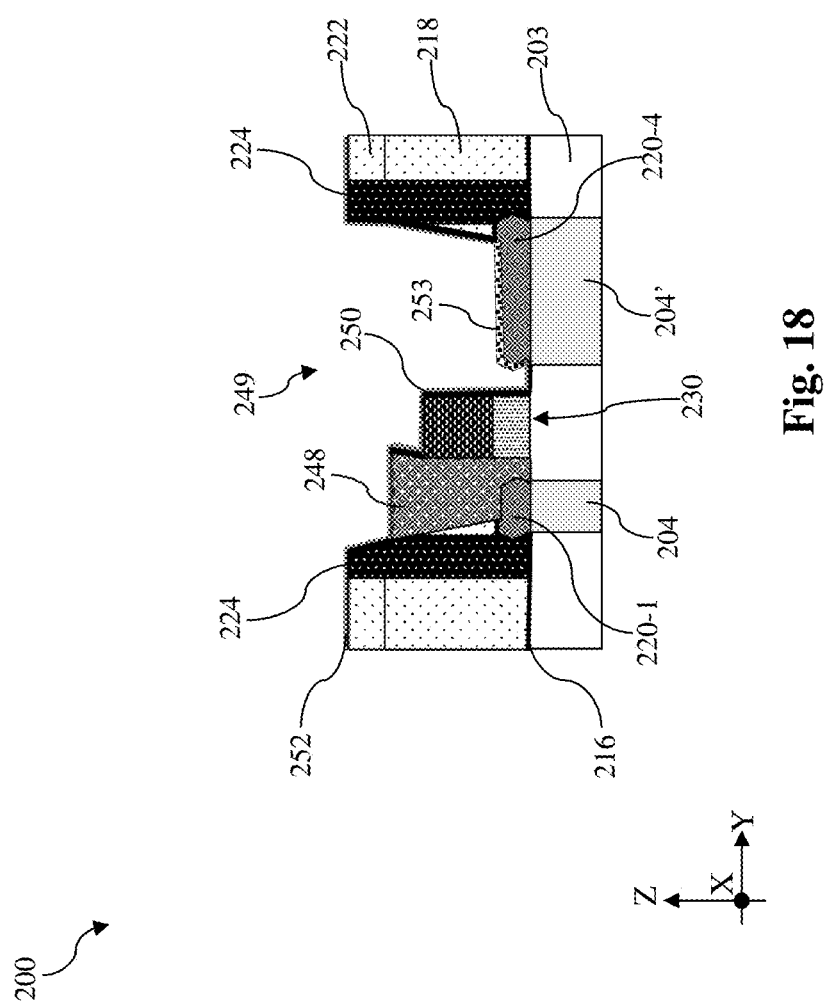

Referring to FIGS. 1, 17 and 18, method 100 includes a block 112 where a silicide feature 253 is formed over the exposed second source/drain feature 220-4. In an example process, a metal precursor layer 252 is conformally deposited over the contact opening 249, including over the fourth source/drain feature 220-4 and over the liner 250. In some instances, the metal precursor layer 252 is deposited using physical vapor deposition (PVD), CVD, or ALD. The metal precursor layer 252 may include nickel (Ni), cobalt (Co), tantalum (Ta), or titanium (Ti). The workpiece 200 is then annealed to bring about silicidation reaction between silicon in the fourth source/drain feature 220-4 and the metal precursor layer 252. The silicidation reaction results in a silicide feature 253 on the fourth source/drain feature 220-4. In some examples, the silicide feature 253 may include nickel silicide, cobalt silicide, tantalum silicide, or titanium silicide. The silicide feature 253 may reduce the contact resistance between the fourth second source/drain feature 220-4 and a metal fill layer 254 (shown in FIG. 19) to be deposited over the silicide feature 253. In one embodiment, the silicide feature 253 is formed of titanium silicide.

Figure 19:
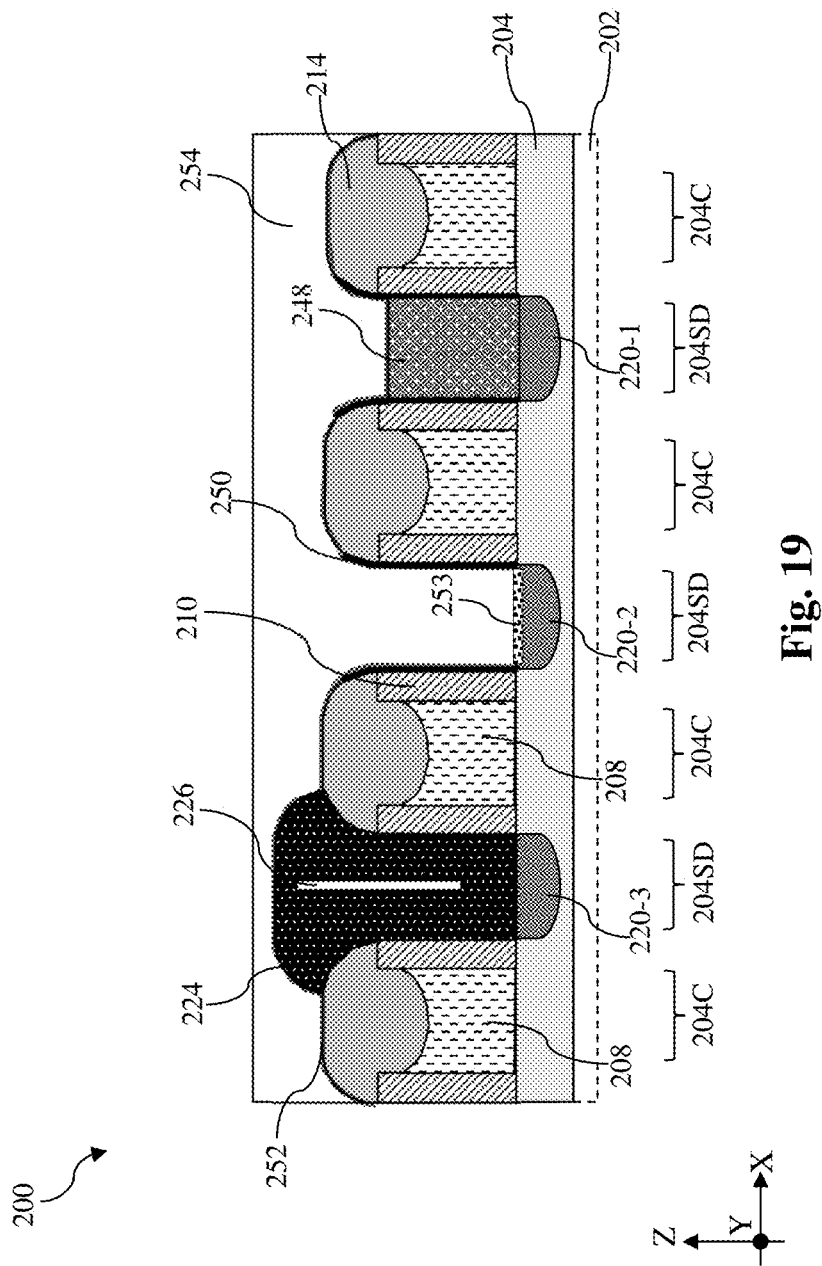
Figure 20:
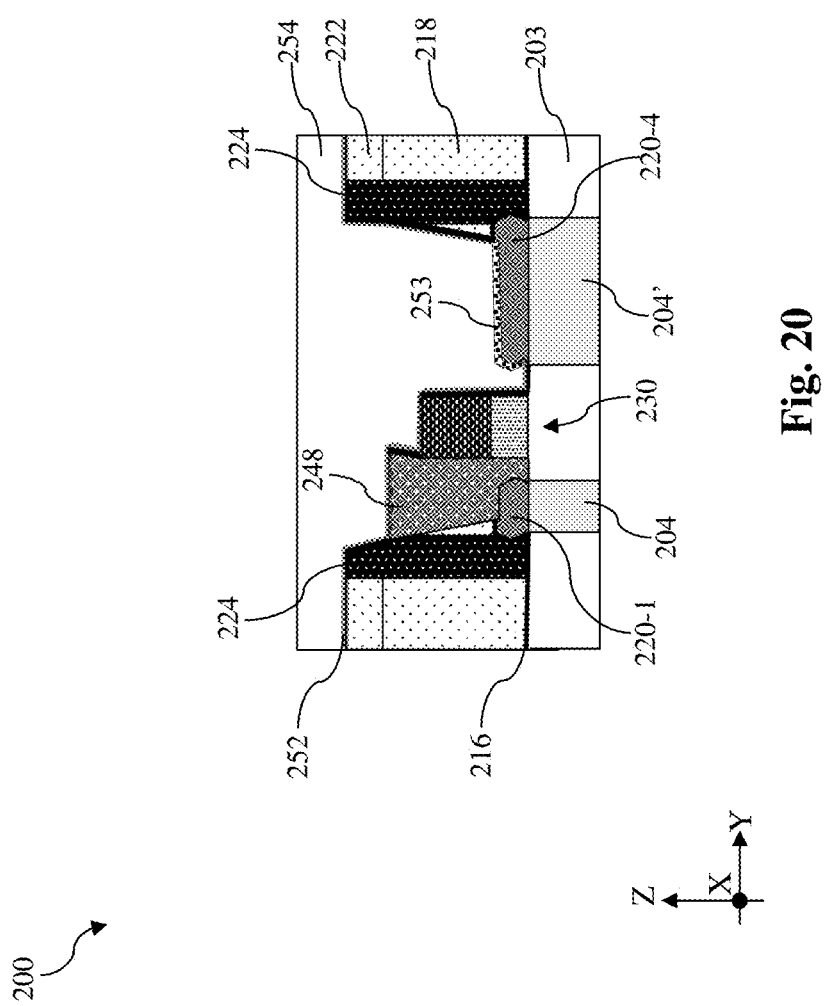

Referring to FIGS. 1, 19 and 20, method 100 includes a block 114 where a metal fill layer 254 is deposited over the silicide feature 253 and the dielectric feature 248. In some embodiment, at block 114, the metal fill layer 254 is in direct contact with the silicide feature 253 and is in electrical communication with the fourth source/drain feature 220-4 by way of the silicide feature 253. In some instances, the metal fill layer 254 may include tungsten (W), ruthenium (Ru), cobalt (Co), copper (Cu), titanium (Ti), titanium nitride (TiN), tantalum (Ta), tantalum nitride (TaN), molybdenum (Mo), or nickel (Ni) and may be deposited using PVD or a suitable deposition method. As shown in FIG. 19, the metal fill layer 254 may be deposited over the SAC layers 214 and the contact cut feature 224. Referring to FIG. 20, the metal fill layer 254 is spaced apart from the first source/drain feature 220-1 by the dielectric feature 248.

Figure 21:
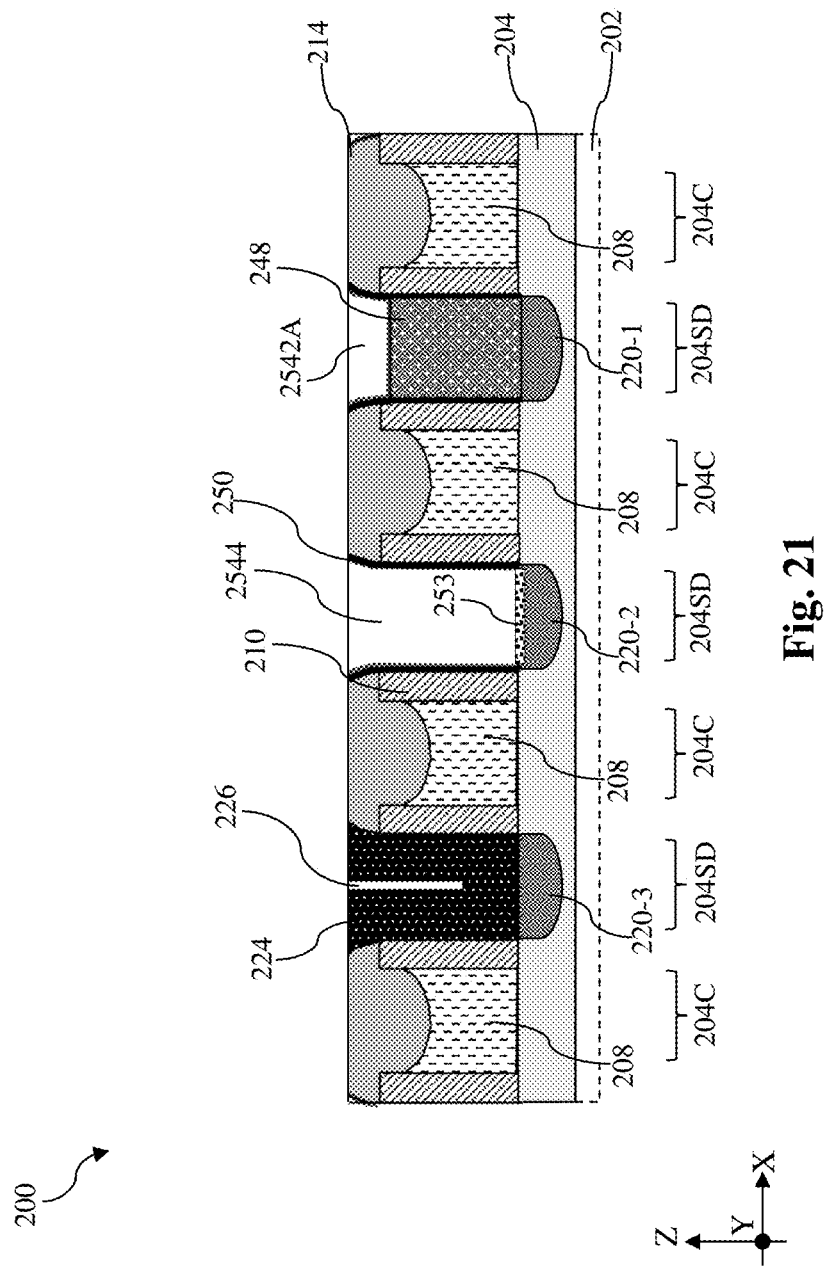
Figure 22:
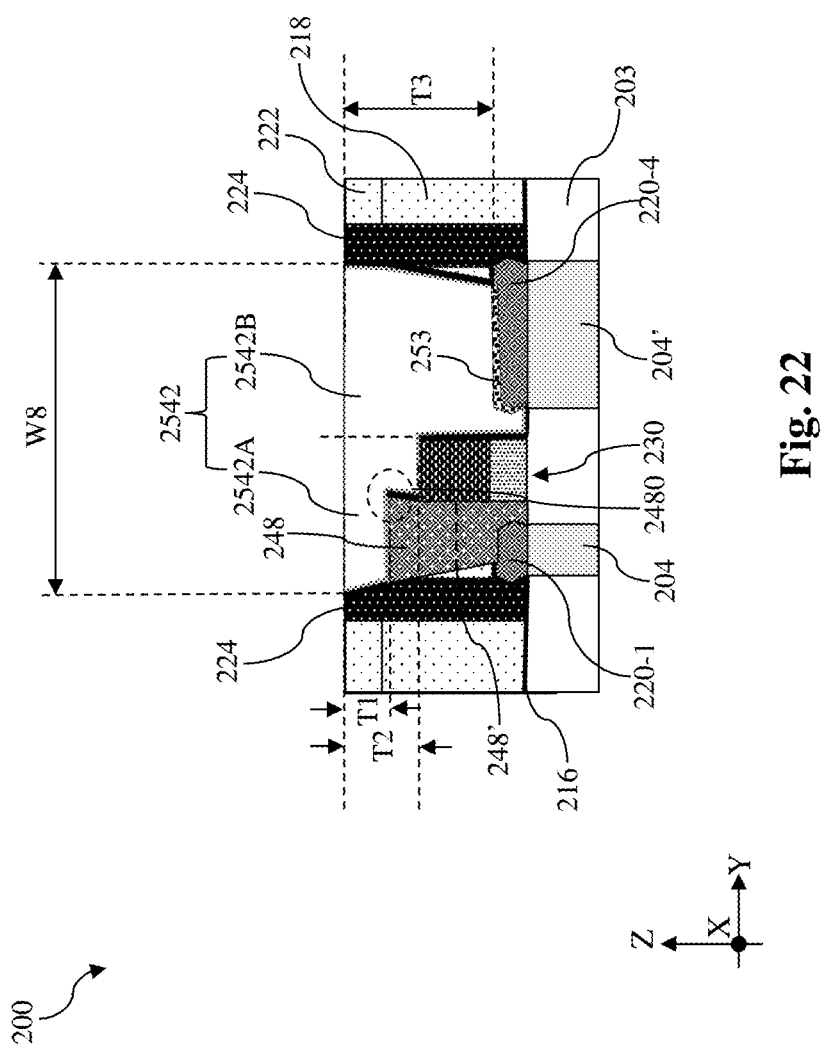

Referring to FIGS. 1, 21 and 22, method 100 includes a block 116 where the workpiece 200 is planarized. At block 116, the metal fill layer 254 is planarized until the SAC layers 214 and the contact cut features 224 are exposed on a top planar surface of the workpiece 200. As shown in FIGS. 21 and 22, the planarization removes the connecting portion of the metal fill layer 254 and allows the contact cut features 224 and the SAC layers 214 to divide metal fill layer 254 into separate contact features. For example, after the planarization at block 116, a first source/drain contact 2542 is formed over the first source/drain feature 220-1 and the fourth source/drain feature 220-4, and a second source/drain contact 2544 is formed over the second source/drain feature 220-2. Referring to FIG. 22, along the Y direction and between two contact cut features 224, the first source/drain contact 2542 includes a first portion 2542A and a second portion 2542B. The first portion 2542A overhangs the first source/drain feature 220-1 and the second portion 2542B is electrically coupled to the fourth source/drain feature 220-4 by way of the silicide feature 253. Put differently, the first source/drain contact 2542 spans over the first source/drain feature 220-1 and the fourth source/drain feature 220-4 and the first portion 2542A "flies" over the first source/drain feature 220-1. The first portion 2542A is spaced apart from the first source/drain feature 220-1 by the dielectric feature 248. The boundary between the first portion 2542A and the second portion 2542B roughly falls over an edge of the dielectric fin 230, as indicated by the dotted line. The first portion 2542A also extends over the dielectric fin 230. Reference is briefly made to FIG. 21, operations at block 116 may also form the second source/drain contact 2544 that is electrically coupled to the second source/drain feature 220-2 by way of the silicide feature 253 disposed on the second source/drain feature 220-2. As described above, the planarization may expose the seam 226 in the contact cut feature 224, as shown in FIG. 21.

Reference is still made to FIG. 22. The first source/drain contact 2542 tracks the topography over the first source/drain feature 220-1 and the fourth source/drain feature 220-4. The first portion 2542A includes a first thickness T1 measured from a top surface of the dielectric feature 248, a second thickness T2 measured from a top surface of the dielectric fin 230. The second portion 2542B includes a third thickness T3 measured a top surface of the silicide feature 253. The third thickness T3 is greater than the first thickness T1 or the second thickness T2. In some embodiments, the first thickness T1 may be between about 5 nm and about 65 nm, the second thickness T2 may be between about 5 nm and about 65 nm, the third thickness T3 may be between about 10 nm and about 70 nm. According to the present disclosure, the first thickness T1 of the first portion 2542A is smaller than the third thickness T3 of the second portion 2542B so that a parasitic capacitance between the first source/drain contact 2542 and adjacent gate structures 208 may be reduced. In order for method 100 to be worthwhile, a ratio of the first thickness T1 to the third thickness T3 should be between about 0.1 and about 0.7. If the ratio of the first thickness T1 to the third thickness T3 is greater than 0.7, the resulted parasitic capacitance reduction may not be enough to justify the additional time and cost associated with performing the operations in method 100. If the ratio of the first thickness T1 to the third thickness T3 is smaller than 0.1, resistance of the thin first portion 2254 may become too high to impact the performance. This is so especially when the first portion 2254A is elongated along the Y direction.

Referring to FIG. 1, method 100 includes a block 118 where further processes are performed. Such further processes may include formation of contact vias over source/drain contacts (such as the first source/drain contact 2542 and the second source/drain contact 2544), formation of gate contacts, and formation of an interconnect structure over the workpiece 200. The interconnect structure includes a plurality of metal layers embedded in a plurality of intermetal dielectric (IMD) layer. Each of plurality of metal layers includes plurality of metal lines and a plurality of contact vias. The interconnect structure functionally connects the gate contacts and the source/drain contacts (such as the first source/drain contact 2542 and the second source/drain contact 2544) and allows the semiconductor device 200 to perform its intended functions.

Figure 23:
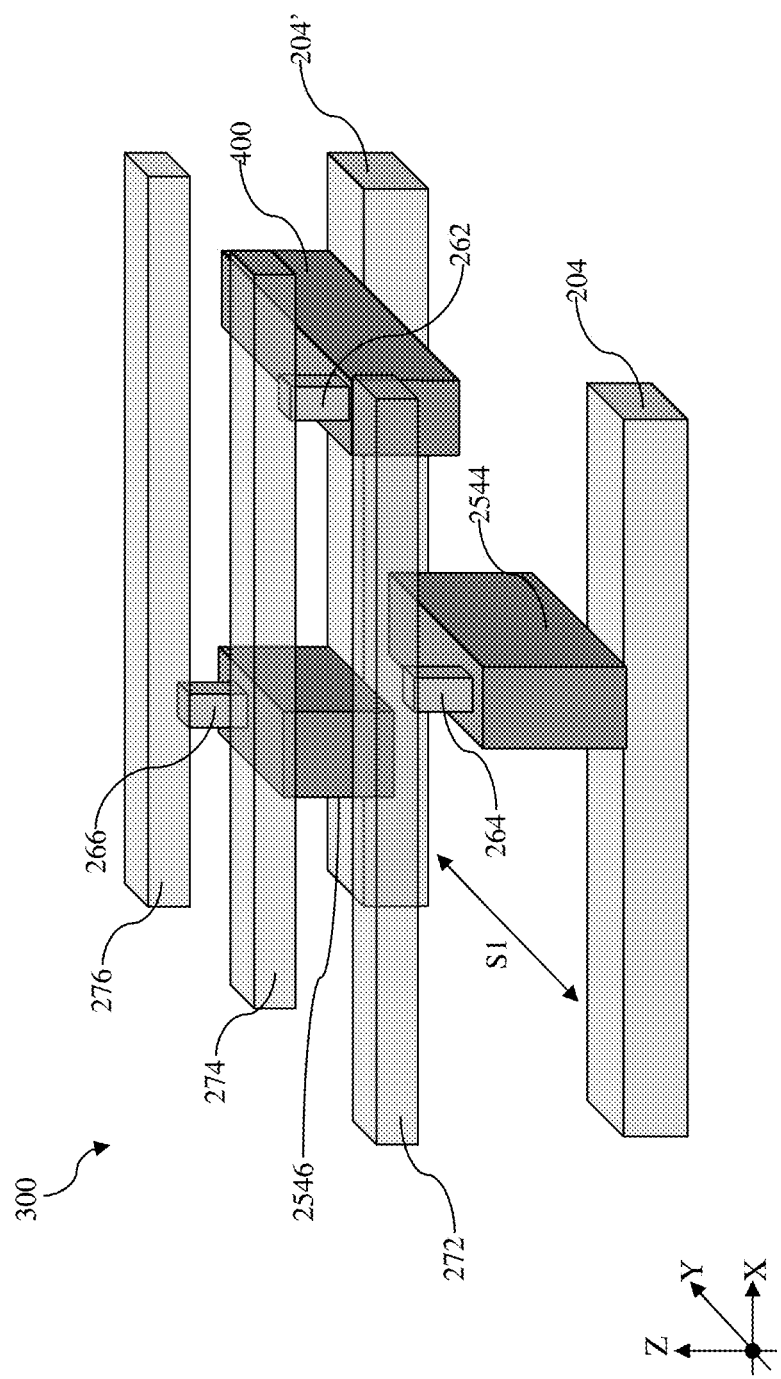
FIG. 23 is a schematic perspective view of an example contact structure that includes a first number of metal lines, according to one or more aspects of the present disclosure.

Embodiments of the present disclosure provide benefits. For example, the source/drain contacts of the present disclosure allow reduction of the number of metal lines. FIG. 23 illustrates a first semiconductor structure 300. The first semiconductor structure 300 includes a first active region 204 and a second active region 204'. A standard source/drain contact 400 and a third source/drain contact 2546 are coupled to different source/drain features over the second active region 204'. A second source/drain contact 2544 is coupled to a source/drain feature over the first active region 204. Because the standard source/drain contact 400 is not to be shorted to the third source/drain feature, they are not electrically coupled to the same metal line. As shown in FIG.

Figure 24:
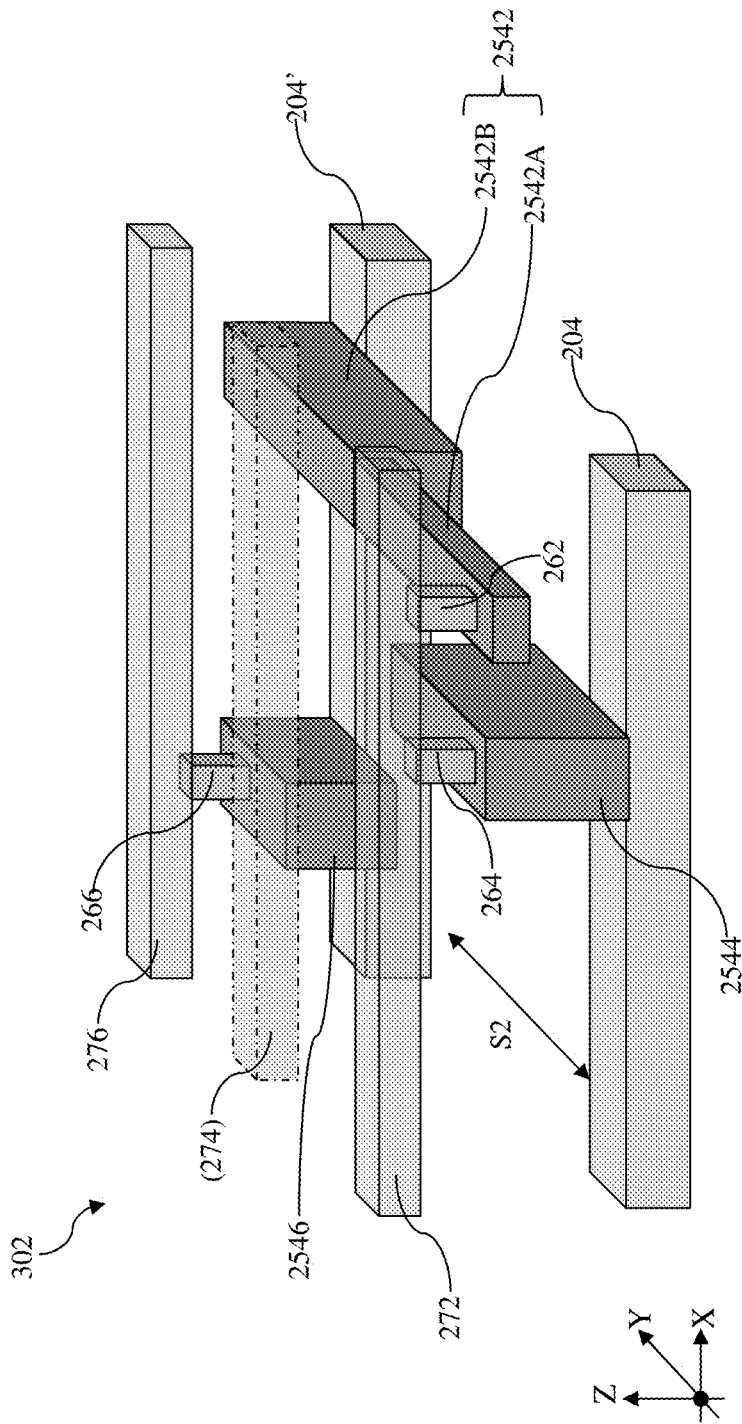
FIG. 24 is a schematic perspective view of a contact structure that includes a second number of metal lines, according to one or more aspects of the present disclosure.

23, the standard source/drain contact 400 is electrically coupled to a second metal line 274 by way of a first contact via 262, the third source/drain contact 2546 is coupled to the third metal line 276 by way of a third contact via 266, and the second source/drain contact 2544 is coupled to a first metal line 272 by way of a second contact via 264. A first spacing S1 between the first active region 204 and the second active region 204' is required to accommodate the three metal lines (i.e., the first metal line 272, the second metal line 274, and the third metal line 276). FIG. 24 illustrates a second semiconductor structure 302. Different from the first semiconductor structure 300 in FIG. 23, the second semiconductor structure 302 includes the first source/drain contact 2542 of the present disclosure, instead of the standard source/drain contact 400. The first portion 2542A provides extension of the first source/drain contact 2542 towards the first active region 204 and relocates the first contact via 262. The relocation allows the first contact via 262 to couple to the first metal line 272. This relocation also allows elimination of the second metal line 274 (in dotted lines). The elimination of the second metal line 274 reduces a second spacing S2 between the first active region 204 and the second active region 204'. That is, the second spacing S2 in FIG. 24 is smaller than the first spacing S1 in FIG. 23. With respect to a cell or a standard cell having a cell height (along the lengthwise direction of the gate structures) and a cell width (along the lengthwise direction of the active regions), reduction of spacings between active regions may be translated into reduction of a cell height of the respective cell or standard. It is observed that implementation of the source/drain contacts of the present disclosure may lower a ratio of the cell height to the cell width to a range between about 1.1 and about 1.4, including between 1.2 and 1.3.

Figure 25:
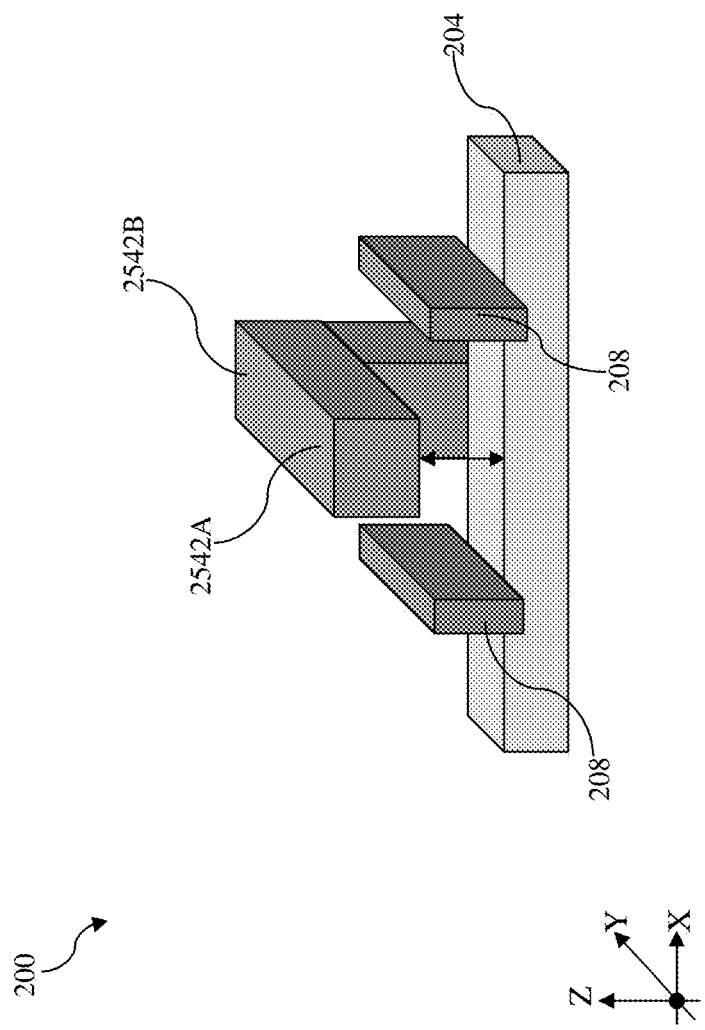
FIG. 25 is a schematic perspective view of a contact structure according to one or more aspects of the present disclosure.

For another example, the source/drain contacts of the present disclosure allow relocation of contact vias without the penalty of increased parasitic capacitance. Referring to FIG. 21, because a top surface of the dielectric feature 248 is higher than top surfaces of adjacent gate structure 208, the first portion 2542A does not overlap the adjacent gate structures 208 along the X direction. In other words, a bottom surface of the first portion 2542A is higher than top surfaces of the adjacent gate structures 208. FIG. 25 illustrates the spatial relationship between the first portion 2542A and the adjacent date structures 208. Due to the presence of the dielectric feature 248, the first portion 2542A is spaced apart from the first active region 204 (or a source/drain contact over the first active region 204) by more than heights of the adjacent gate structures 208. The dielectric feature 248 (shown in FIG. 21) under the first portion 2542A reduces areal overlap with adjacent gate structures 208, thereby reducing parasitic capacitance. Compared to other source/drain contacts that overlap with adjacent gate structure, the source/drain contacts of the present disclosure may improve ring oscillator speed of the semiconductor device by about 0.5% to about 1%.

Thus, one of the embodiments of the present disclosure provides a semiconductor structure. The semiconductor structure includes a first fin structure and a second fin structure over a substrate, a first source/drain feature disposed over the first fin structure and a second source/drain feature disposed over the second fin structure, a dielectric feature disposed over the first source/drain feature, and a contact structure formed over the first source/drain feature and the second source/drain feature. The contact structure is electrically coupled to the second source/drain feature and is separated from the first source/drain feature by the dielectric feature.

In some embodiments, the semiconductor structure may further include a dielectric fin disposed between the first source/drain feature and the second source/drain feature over the substrate, wherein the dielectric feature extends along the dielectric fin. In some implementations, a top surface of the dielectric feature is higher than a top surface of the dielectric fin. In some instances, the semiconductor structure may further include a spacer disposed between a sidewall of the dielectric fin and the contact structure. In some embodiments, the spacer includes silicon nitride or silicon oxynitride. In some implementations, the semiconductor structure may further include a silicide layer disposed between the second source/drain feature and the contact structure. In some embodiments, the contact structure extends lengthwise along a direction from over the first source/drain feature to over the second source/drain feature and along the direction, the contact structure is disposed between two dielectric cut features. In some implementations, each of the two dielectric cut features includes a seam. In some instances, the semiconductor structure may further include a gate structure wrapping over the first fin structure and the second fin structure and a top surface of the dielectric feature is higher than a top surface of the gate structure. In some instances, the gate structure is spaced apart from the dielectric feature by a gate spacer.

In another of the embodiments, a contact structure is provided. The contact structure includes a first source/drain feature and a second source/drain feature, a dielectric fin disposed between the first source/drain feature and the second source/drain feature, a dielectric feature disposed over the first source/drain feature and extending along a sidewall of the dielectric fin, and a contact feature including a first portion that is disposed over the dielectric feature and the dielectric fin and a second portion that is electrically coupled to the second source/drain feature. The first portion overhangs the first source/drain feature.

In some embodiments, the contact structure may further include a contact via disposed on the first portion. In some implementations, the dielectric fin includes a first layer and a second layer disposed over the first layer. The first layer includes silicon oxide and the second layer includes silicon and nitrogen. In some embodiments, the dielectric feature includes silicon oxide. In some embodiments, the contact structure may further include a gate structure adjacent the first source/drain feature and the second source/drain feature and a bottom surface of the first portion is higher than a top surface of the gate structure. In some implementations, the second portion is spaced apart from the dielectric fin by a liner.

In yet another of the embodiments, a method is provided. The method includes receiving a workpiece that includes a first fin structure and a second fin structure over a substrate, a gate structure wrapping over the first fin structure and the second fin structure, a first source/drain feature over the first fin structure, and a second source/drain feature over the second fin structure. The method further includes selectively forming a dielectric feature over the first source/drain feature, and after the selectively forming, forming a contact structure over the first source/drain feature and the second source/drain feature such that the contact structure is electrically connected to the second source/drain feature and is separated from the first source/drain feature by the dielectric feature.

In some embodiments, the selectively forming includes forming a photoresist layer over the first source/drain feature and the second source/drain feature, patterning the photoresist layer to form a patterned photoresist layer that includes an opening to expose the first source/drain feature, depositing a dielectric material in the opening, and etching back the dielectric material to form the dielectric feature. In some instances, the etching back removes the patterned photoresist layer. In some implementations, the method may further include before the forming of the contact structure, forming a liner along sidewalls of the dielectric feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first fin structure and a second fin structure over a substrate;
    a first source/drain feature disposed over the first fin structure and a second source/drain feature disposed over the second fin structure;
    a dielectric feature disposed over the first source/drain feature, the dielectric feature interfacing a top surface and a sidewall of the first source/drain feature; and
    a contact structure formed over the first source/drain feature and the second source/drain feature,
    wherein the contact structure is electrically coupled to the second source/drain feature and is vertically separated from the first source/drain feature by the dielectric feature,
    wherein the first fin structure and the second fin structure extend lengthwise along a first direction and are spaced apart from one another along a second direction perpendicular to the first direction,
    wherein the contact structure extends lengthwise along the second direction to span over the first source/drain feature and the second source/drain feature,
    wherein a width of the first fin structure is smaller than a width of the second fin structure.

2. The semiconductor structure of claim 1, further comprising:
    a dielectric fin disposed between the first source/drain feature and the second source/drain feature over the substrate, wherein the dielectric feature interfaces a sidewall of the dielectric fin.

3. The semiconductor structure of claim 2, wherein a top surface of the dielectric feature is higher than a top surface of the dielectric fin.

4. The semiconductor structure of claim 2, further comprising a spacer disposed between a sidewall of the dielectric fin and the contact structure.

5. The semiconductor structure of claim 4, wherein the spacer comprises silicon nitride or silicon oxynitride.

6. The semiconductor structure of claim 1, further comprising a silicide layer disposed between the second source/drain feature and the contact structure.

7. The semiconductor structure of claim 1,
    wherein the contact structure extends lengthwise along a direction from over the first source/drain feature to over the second source/drain feature,
    wherein, along the direction, the contact structure is disposed between two dielectric cut features.

8. The semiconductor structure of claim 7, wherein each of the two dielectric cut features comprises a seam.

9. The semiconductor structure of claim 1, further comprising:
    a gate structure wrapping over the first fin structure and the second fin structure,
    wherein a top surface of the dielectric feature is higher than a top surface of the gate structure.

10. The semiconductor structure of claim 9, wherein the gate structure is spaced apart from the dielectric feature by a gate spacer.

11. A contact structure, comprising:
    a first fin and a second fin extending parallel to one another along a first direction and spaced apart from one another by an isolation feature along a second direction perpendicular to the first direction;
    a first source/drain feature disposed on a top surface of the first fin and a second source/drain feature disposed on a top surface of the second fin;
    a dielectric feature disposed over and in contact with the first source/drain feature; and
    a contact feature spanning lengthwise along the second direction over the dielectric feature and the second source/drain feature to electrically couple to the second source/drain feature,
    wherein the dielectric feature interfaces the contact feature.

12. The contact structure of claim 11, further comprising:
    a dielectric fin disposed over the isolation feature and between the first source/drain feature and the second source/drain feature.

13. The contact structure of claim 12, wherein the dielectric feature extends along a sidewall of the dielectric fin.

14. The contact structure of claim 12, wherein the contact feature spans over the dielectric fin.

15. The contact structure of claim 12, further comprising a dielectric liner sandwiched between the contact feature and a sidewall of the dielectric fin.

16. The contact structure of claim 12,
    wherein the dielectric fin comprises a first layer and a second layer over the first layer,
    wherein a composition of the first layer is different from a composition of the second layer.

17. A contact structure, comprising:
    a first fin and a second fin over a substrate;
    an isolation feature over the substrate and disposed between the first fin and the second fin;
    a first source/drain feature over the first fin;
    a second source/drain feature over the second fin;
    a silicide feature over the second source/drain feature;
    a dielectric feature disposed over and interfacing the first source/drain feature; and
    a contact feature comprising a first portion that is disposed over the dielectric feature and a second portion that interfaces the silicide feature,
    wherein the isolation feature interfaces a top surface of the substrate, a sidewall of the first fin, and a sidewall of the second fin.

18. The contact structure of claim 17, wherein the dielectric feature interfaces the first source/drain feature and the isolation feature.

19. The contact structure of claim 17,
    wherein the first fin and the second fin are spaced apart from one another along a direction, wherein the first fin comprises a first width along the direction,
wherein the second fin comprises a second width along the direction,
wherein the second width is greater than the first width.

20. The contact structure of claim 17, wherein the contact feature is spaced apart from a sidewall of the dielectric feature by a liner.

\* \* \* \* \*